United States Patent
Ko et al.

(10) Patent No.: US 10,211,196 B2
(45) Date of Patent: Feb. 19, 2019

(54) ELECTROSTATIC DISCHARGE PROTECTION DEVICE AND ELECTRONIC DEVICE HAVING THE SAME

(71) Applicant: SAMSUNG ELECTRONICS CO., LTD., Suwon-si (KR)

(72) Inventors: Jae-Hyok Ko, Hwaseong-si (KR);
Min-Chang Ko, Hwaseong-si (KR);
Han-Gu Kim, Seongnam-si (KR);
Jong-Kyu Song, Incheon (KR); Jin Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/234,532

(22) Filed: Aug. 11, 2016

(65) Prior Publication Data

US 2017/0062406 A1 Mar. 2, 2017

(30) Foreign Application Priority Data

Aug. 31, 2015 (KR) .................. 10-2015-0122481

(51) Int. Cl.
*H01L 27/02* (2006.01)
*H01L 29/74* (2006.01)
*H01L 29/78* (2006.01)
*H01L 29/66* (2006.01)

(52) U.S. Cl.
CPC ...... *H01L 27/0248* (2013.01); *H01L 27/0262* (2013.01); *H01L 29/742* (2013.01); *H01L 29/7412* (2013.01); *H01L 29/7436* (2013.01); *H01L 29/7817* (2013.01); *H01L 29/66681* (2013.01)

(58) Field of Classification Search
CPC ............. H01L 27/0259; H01L 27/0262; H01L 29/74–29/749; H01L 29/7817–29/7821
See application file for complete search history.

(56) References Cited

U.S. PATENT DOCUMENTS

| | | | |
|---|---|---|---|
| 6,016,002 A | 1/2000 | Chen et al. | |
| 6,137,140 A * | 10/2000 | Efland ................. | H01L 27/0711 257/139 |
| 6,144,070 A * | 11/2000 | Devore ................... | H01L 23/60 257/343 |
| 6,365,940 B1 * | 4/2002 | Duvvury ............. | H01L 27/0262 257/355 |
| 7,414,287 B2 * | 8/2008 | Pendharkar .......... | H01L 27/088 257/341 |

(Continued)

FOREIGN PATENT DOCUMENTS

KR 10-0320676 B1 1/2002
KR 10-2009-0098237 A 9/2009

(Continued)

*Primary Examiner* — Eric A. Ward
(74) *Attorney, Agent, or Firm* — Sughrue Mion, PLLC

(57) ABSTRACT

An electrostatic discharge (ESD) protection device includes an N-type laterally diffused metal oxide semiconductor (LDMOS) transistor including a source electrode, a gate electrode, and a well bias electrode that are connected to a first pad receiving a first voltage, and a drain electrode connected to a middle node. The ESD protection device further includes a silicon controlled rectifier (SCR) connected between the middle node and a second pad receiving a second voltage higher than the first voltage.

14 Claims, 21 Drawing Sheets

(56) References Cited

U.S. PATENT DOCUMENTS

| | | | |
|---|---|---|---|
| 7,719,026 B2 | 5/2010 | Lou et al. | |
| 7,800,127 B1* | 9/2010 | Vashchenko | H01L 27/0262 |
| | | | 257/173 |
| 7,838,924 B2* | 11/2010 | Boselli | H01L 27/0259 |
| | | | 257/328 |
| 7,842,971 B2 | 11/2010 | Liu et al. | |
| 8,760,831 B2 | 6/2014 | Abou-Khalil et al. | |
| 8,841,727 B1* | 9/2014 | Walker | H01L 29/0649 |
| | | | 257/355 |
| 9,082,620 B1* | 7/2015 | Wang | H01L 27/0262 |
| 9,099,523 B2* | 8/2015 | Salman | H01L 29/7436 |
| 9,343,567 B2* | 5/2016 | He | H01L 29/7816 |
| 2005/0179087 A1* | 8/2005 | Lin | H01L 27/0266 |
| | | | 257/356 |
| 2010/0301418 A1* | 12/2010 | Kim | H01L 27/0262 |
| | | | 257/360 |

FOREIGN PATENT DOCUMENTS

| | | |
|---|---|---|
| KR | 10-2013-0075820 A | 7/2013 |
| KR | 10-2013-0120243 A | 11/2013 |
| KR | 10-1476005 B1 | 12/2014 |

\* cited by examiner

ELECTROSTATIC DISCHARGE PROTECTION DEVICE AND ELECTRONIC DEVICE HAVING THE SAME

CROSS-REFERENCE TO RELATED APPLICATION

This application claims priority from Korean Patent Application No. 10-2015-0122481, filed on Aug. 31, 2015, in the Korean Intellectual Property Office (KIPO), the disclosure of which is herein incorporated by reference in its entirety.

BACKGROUND

1. Field

Apparatuses consistent with example embodiments relate to an electrostatic discharge (ESD) protection technology, and more particularly to an ESD protection device and an electronic device including the ESD protection device.

2. Description of the Related Art

As a size of a semiconductor device decreases and a density of a semiconductor device increases, an ESD protection device protecting a semiconductor device from damage caused by an ESD, becomes more important.

Conventionally, a diode, a resistor, and a transistor are generally used in the ESD protection device. Recently, a silicon controlled rectifier (SCR) is widely used as the ESD protection device.

However, when a holding voltage of the SCR is lower than an operational voltage of the semiconductor device, the semiconductor device may not operate correctly.

Therefore, a semiconductor device having a high operation voltage, such as a power management integrated circuit (PMIC), may use an ESD protection device having a high holding voltage as well as a high ESD level.

SUMMARY

One or more example embodiments provide an electrostatic discharge (ESD) protection device that has a high holding voltage and a high ESD level.

One or more example embodiments provide an electronic device including the ESD protection device.

According to example embodiments, an electrostatic discharge (ESD) protection device includes an N-type laterally diffused metal oxide semiconductor (LDMOS) transistor including a source electrode, a gate electrode, and a well bias electrode that are connected to a first pad receiving a first voltage, and a drain electrode connected to a middle node. The ESD protection device further includes a silicon controlled rectifier (SCR) connected between the middle node and a second pad receiving a second voltage higher than the first voltage.

In example embodiments, the SCR may include an N-type drift region corresponding to a base of a PNP bipolar junction transistor parasitically formed in the SCR, and an N-type floating diffusion region disposed in the N-type drift region, the N-type floating diffusion region being electrically floating.

An impurity concentration of the N-type floating diffusion region may be higher than an impurity concentration of the N-type drift region.

The SCR may include an N-type drift region, a P-type body region contacting the N-type drift region, a first N-type well region disposed in the N-type drift region, and an N-type floating diffusion region disposed in the N-type drift region, the N-type floating diffusion region being spaced apart from the first N-type well region and being electrically floating. The SCR may further include a first N-type doping region disposed in the first N-type well region, the first N-type doping region being connected to the second pad, a first P-type doping region disposed in the N-type drift region between the first N-type well region and the N-type floating diffusion region, the first P-type doping region being connected to the second pad, a second N-type doping region disposed in the P-type body region, the second N-type doping region being connected to the middle node, and a second P-type doping region disposed in the P-type body region, the second P-type doping region being connected to the middle node.

The N-type floating diffusion region may be spaced apart from the first N-type well region in a direction of the P-type body region.

The second N-type doping region may contact the second P-type doping region.

The first N-type well region and the N-type floating diffusion region may be doped with an N-type dopant.

The SCR may further include a first gate disposed above the N-type drift region and the P-type body region and between the N-type floating diffusion region and the second N-type doping region, the first gate being connected to the middle node.

The second N-type doping region may surround the second P-type doping region in a track pattern.

The first gate may surround the second N-type doping region in a track pattern.

The N-type floating diffusion region may surround the first gate in a track pattern.

The SCR may further include a diode including a cathode electrode connected to the second pad, and an anode electrode connected to the first gate, and a resistor connected between the first gate and the middle node. The diode may include a P-type LDMOS transistor including a second gate connected to the cathode electrode, a second N-type well region, and a third N-type doping region disposed in the second N-type well region, the third N-type doping region being connected to the cathode electrode. The P-type LDMOS transistor may further include a P-type drift region and a third P-type doping region disposed in the P-type drift region, the third P-type doping region being connected to the anode electrode.

The second gate may be doped with an N-type impurity.

The second gate and the third N-type doping region may be doped with an N-type dopant.

The P-type LDMOS transistor may further include vertical contacts connected to the second gate and the third N-type doping region, respectively, and a metal pattern connected to the vertical contacts.

The third P-type doping region may correspond to a drain region of the P-type LDMOS transistor, and the third N-type doping region may correspond to a well bias region of the P-type LDMOS transistor.

The diode may be configured to apply, to the first gate, an induction voltage that is determined based on a capacitance between the cathode electrode and the anode electrode, in response to the second pad receiving the second voltage lower than a breakdown voltage of the diode, and apply, to the first gave, a division voltage that is determined based on a ratio of a resistance of the resistor and an on-state resistance of the diode, in response to the second pad receiving the second voltage higher than the breakdown voltage.

The P-type LDMOS transistor may further include a P-type well region, the P-type drift region may be disposed in the P-type well region, and an impurity concentration of the P-type well region may be lower than an impurity concentration of the P-type drift region.

The N-type LDMOS transistor may include a P-type well region, a first N-type doping region disposed in the P-type well region, the first N-type doping region being connected to the source electrode, and a P-type doping region disposed in the P-type well region, the P-type doping region being connected to the well bias electrode. The N-type LDMOS transistor may further include an N-type drift region, a second N-type doping region disposed in the N-type drift region, the second N-type doping region being connected to the drain electrode, and a gate disposed above a portion of the P-type well region and a portion of the N-type drift region, the gate being connected to the gate electrode.

The N-type LDMOS transistor may further include an N-type well region, the N-type drift region may be disposed in the N-type well region, and an impurity concentration of the N-type well region may be lower than an impurity concentration of the N-type drift region.

The N-type LDMOS transistor may further include a P-type deep well region, and the P-type well region may be disposed in the P-type deep well region.

The ESD protection device may further include a shunting diode including an anode electrode connected to the first pad, and a cathode electrode connected to the second pad.

The shunting diode may include a P-type LDMOS transistor including a gate connected to the cathode electrode, an N-type well region, and an N-type doping region disposed in the N-type well region, the N-type doping region being connected to the cathode electrode. The P-type LDMOS transistor may further include a P-type drift region, and a P-type doping region disposed in the P-type drift region, the P-type doping region being connected to the anode electrode.

An electronic device may include a functional block connected between a supply voltage pad receiving a supply voltage, and a ground voltage pad coupled to a ground voltage, the functional block operating using the supply voltage, and the ESD protection device connected between the supply voltage pad and the ground voltage pad. The first voltage pad receiving the first voltage may be the ground voltage pad, and the second voltage pad receiving the second voltage may be the supply voltage pad.

An electronic device may include a functional block connected to a supply voltage pad receiving a supply voltage, a ground voltage pad coupled to a ground voltage, and a data input/output pad, the functional block communicating, using the supply voltage, data through the data input/output pad, and the ESD protection device of claim connected between the data input/output pad and the ground voltage pad. The first voltage pad receiving the first voltage may be the ground voltage pad, and the second voltage pad receiving the second voltage may be the data input/output pad.

According to example embodiments, an electrostatic discharge (ESD) protection device includes an N-type laterally diffused metal oxide semiconductor transistor connected between a first pad receiving a first voltage, and a middle node. The ESD protection device further includes an N-type drift region, a P-type body region contacting the N-type drift region, a first N-type well region disposed in the N-type drift region, and an N-type floating diffusion region disposed in the N-type drift region, and spaced apart from the first N-type well region in a direction of the P-type body region.

The ESD protection device further includes a first N-type doping region disposed in the first N-type well region, and connected to a second pad receiving a second voltage higher than the first voltage, a first P-type doping region disposed in the N-type drift region between the first N-type well region and the N-type floating diffusion region, and connected to the second pad, a second N-type doping region disposed in the P-type body region, and connected to the middle node, and a second P-type doping region disposed in the P-type body region, and connected to the middle node.

The ESD protection device further includes a gate disposed above the N-type drift region and the P-type body region and between the N-type floating diffusion region and the second N-type doping region, and connected to the middle node.

The second N-type doping region may surround the second P-type doping region in a track pattern, the first gate may surround the second N-type doping region in a track pattern, and the N-type floating diffusion region may surround the first gate in a track pattern.

The ESD protection device may further include a diode including a cathode electrode connected to the second pad, and an anode electrode connected to the first gate, and a resistor connected between the first gate and the middle node.

BRIEF DESCRIPTION OF THE DRAWINGS

The above and/or other aspects will be more apparent by describing example embodiments with reference to the accompanying drawings.

DETAILED DESCRIPTION

Figure 1:
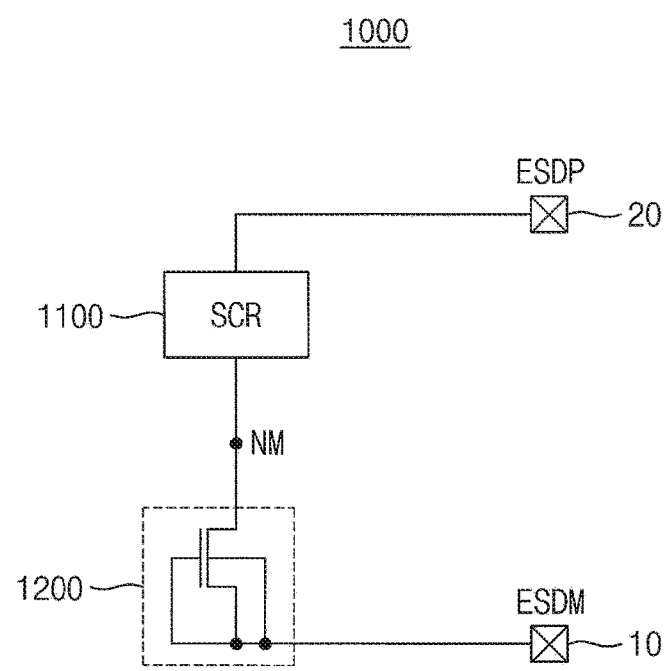
FIG. 1 is a block diagram illustrating an electrostatic discharge (ESD) protection device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electrostatic discharge (ESD) protection device according to example embodiments.

Referring to FIG. 1, an ESD protection device 1000 includes a silicon controlled rectifier (SCR) 1100 and an N-type laterally diffused metal oxide semiconductor (LDMOS) transistor 1200.

The N-type LDMOS transistor 1200 is connected between a first pad ESDM 10 receiving a first voltage and a middle node NM. The N-type LDMOS transistor 1200 includes a source electrode, a gate electrode, and a well bias electrode, which are connected to the first pad 10, and a drain electrode connected to the middle node NM. Therefore, the N-type LDMOS transistor 1200 may have a gate-grounded structure in which a gate and a source are coupled to each other.

The SCR 1100 is connected between a second pad ESDP 20 receiving a second voltage higher than the first voltage and the middle node NM.

As illustrated in FIG. 1, because the ESD protection device 1000 according to example embodiments includes the SCR 1100 serially connected to the N-type LDMOS transistor 1200 of the gate-grounded structure having a high holding voltage, a holding voltage of the ESD protection device 1000 may be further increased.

Although the ESD protection device 1000 is illustrated to include the N-type LDMOS transistor 1200 in FIG. 1, example embodiments are not limited thereto. According to example embodiments, the ESD protection device 1000 may include a P-type LDMOS transistor instead of the N-type LDMOS transistor 1200. Hereinafter, the ESD protection device 1000 will be described to include the N-type LDMOS transistor 1200 for ease of explanation.

Hereinafter, a structure and an operation of the ESD protection device 1000 of FIG. 1 will be described with reference to FIGS. 2 to 18.

Figure 2:
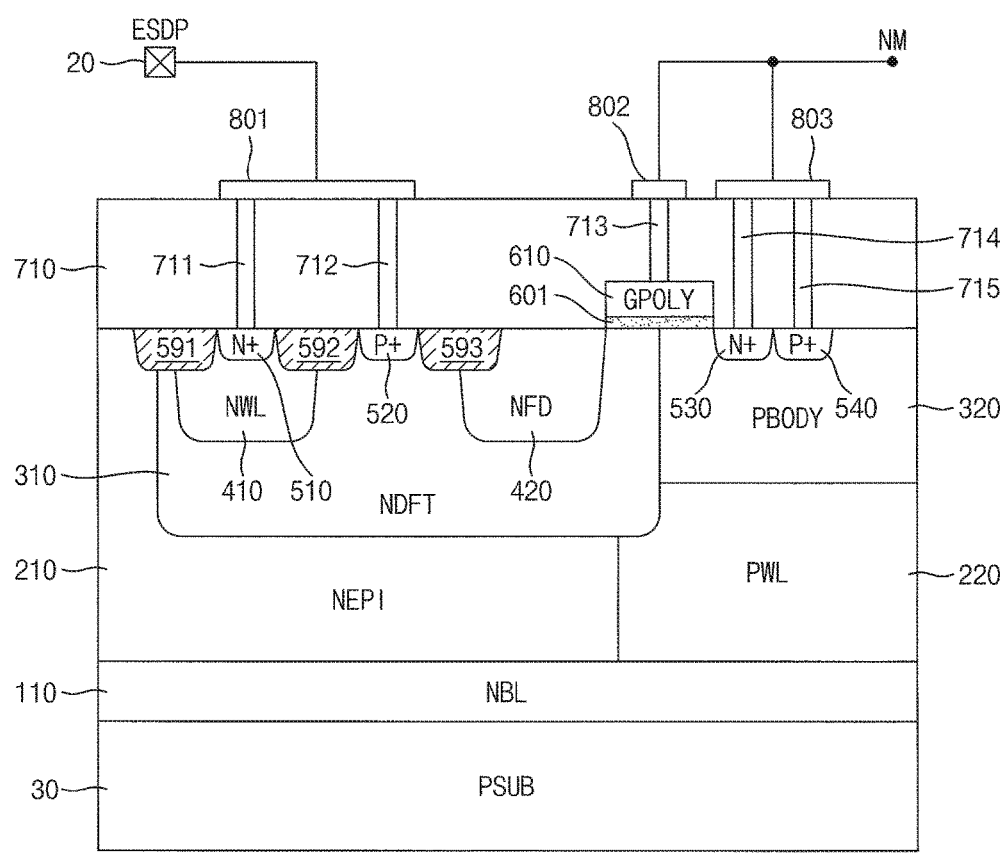
FIG. 2 is a cross-sectional diagram illustrating an example of a silicon controlled rectifier (SCR) included in the ESD protection device of FIG. 1.

FIG. 2 is a cross-sectional diagram illustrating an example of a SCR included in the ESD protection device of FIG. 1.

Referring to FIG. 2, an SCR 1100a includes a first N-type drift region NDFT 310, a P-type body region PBODY 320, a first N-type well region NWL 410, an N-type floating diffusion region NFD 420, a first N-type doping region N+ 510, a first P-type doping region P+ 520, a second N-type doping region N+ 530, a second P-type doping region P+ 540, and a first gate GPOLY 610.

The SCR 1100a includes a semiconductor substrate PSUB 30. For example, the semiconductor substrate 30 may be a P-type semiconductor substrate. The semiconductor substrate 30 may include a silicon (Si) semiconductor substrate, a gallium-arsenic (Ga—As) semiconductor substrate, a silicon-germanium (Si—Ge) semiconductor substrate, a ceramic semiconductor substrate, a quartz semiconductor substrate, a glass semiconductor substrate, etc.

An N-type buried later NBL 110 is disposed on an upper portion of the semiconductor substrate 30. For example, the N-type buried later 110 may be formed by performing an ion-implanting process with an N-type dopant on the semiconductor substrate 30.

An N-type epitaxial layer NEPI 210 and a first P-type well region PWL 220 are disposed on the N-type buried layer 110. For example, the N-type epitaxial layer 210 may be formed by a selective epitaxial growth process, a solid phase epitaxial growth (SPE) process, etc.

The first N-type drift region 310 is disposed in the N-type epitaxial layer 210, and the P-type body region 320 is disposed on the first P-type well region 220. The P-type body region 320 contacts the first N-type drift region 310.

In one or more example embodiments, an impurity concentration of the first N-type drift region 310 may be higher than an impurity concentration of the N-type epitaxial layer 210. In addition, an impurity concentration of the P-type body region 320 may be higher than an impurity concentration of the first P-type well region 220.

The first N-type well region 410 and the N-type floating diffusion region 420 are disposed in the first N-type drift region 310. The N-type floating diffusion region 420 is spaced apart from the first N-type well region 410. For example, the first N-type well region 410 may be formed in a first upper portion of the first N-type drift region 310, and the N-type floating diffusion region 420 may be formed in a second upper portion of the first N-type drift region 310, such that the N-type floating diffusion region 420 is spaced apart from the first N-type well region 410.

In one or more example embodiments, the N-type floating diffusion region 420 is spaced apart from the first N-type well region 410 in a direction of the P-type body region 320.

In one or more example embodiments, an impurity concentration of the first N-type well region 410 may be higher than an impurity concentration of the first N-type drift region 310. In addition, an impurity concentration of the N-type floating diffusion region 420 may be higher than the impurity concentration of the first N-type drift region 310.

In one or more example embodiments, the first N-type well region 410 and the N-type floating diffusion region 420 may be doped simultaneously with a same N-type dopant. Therefore, the impurity concentration of the N-type floating diffusion region 420 may be substantially the same as the impurity concentration of the first N-type well region 410.

The first N-type doping region 510 is disposed in the first N-type well region 410. In one or more example embodiments, an impurity concentration of the first N-type doping region 510 may be higher than the impurity concentration of the first N-type well region 410.

The first P-type doping region 520 is disposed in the first N-type drift region 310. As illustrated in FIG. 2, the first P-type doping region 520 is disposed between the first N-type well region 410 and the N-type floating diffusion region 420.

The second N-type doping region 530 and the second P-type doping region 540 are disposed in the P-type body region 320. In one or more example embodiments, an impurity concentration of the second P-type doping region 540 may be higher than the impurity concentration of the P-type body region 320.

In one or more example embodiments, as illustrated in FIG. 2, the second N-type doping region 530 is disposed in a direction of the first N-type drift region 310 from the second P-type doping region 540, and contacts the second P-type doping region 540.

In one or more example embodiments, an isolation structure 591 for isolating the first N-type doping region 510 from other elements, an isolation structure 592 for isolating the first N-type doping region 510 from the first P-type doping region 520, and an isolation structure 593 for isolating the first P-type doping region 520 from the N-type floating diffusion region 420 are disposed in the first N-type drift region 310. For example, the isolation structures 591, 592 and 593 may be formed using the shallow trench isolation (STI) process.

The first gate 610 is disposed above a boundary area of the first N-type drift region 310 and the P-type body region 320 and between the N-type floating diffusion region 420 and the second N-type doping region 530. In one or more example embodiments, a gate dielectric layer 601 such as an oxide layer is disposed on an upper surface of the first N-type drift region 310 and the P-type body region 320 and between the N-type floating diffusion region 420 and the second N-type doping region 530, and a conduction layer such as a poly-silicon layer may be deposited on the gate dielectric layer 601. The first gate 610 may be formed by patterning the poly-silicon layer. The first gate 610 may be formed of various conductive materials such as metal, poly-silicon, a combination of metal and poly-silicon, etc. An insulation structure may be further disposed at both side walls of the first gate 610.

An interlayer dielectric bulk 710 may be formed, and a corresponding portion of the interlayer dielectric bulk 710 may be etched to expose the first N-type doping region 510, the first P-type doping region 520, the first gate 610, the second N-type doping region 530, and the second P-type doping region 540. A heating process of high temperature may be performed, and then metal may be filled in the etched portions to form vertical contacts 711, 712, 713, 714, and 715, respectively. After performing a planarization process with respect to the upper surface of the interlayer dielectric bulk 710, a metal layer may be deposited on the flattened surface, and then the metal layer may be patterned to form metal patterns 801, 802, and 803.

As illustrated in FIG. 2, the metal pattern 801 is connected to the vertical contacts 711 and 712 connected to the first N-type doping region 510 and the first P-type doping region 520, respectively. The metal pattern 802 is connected to the vertical contact 713 connected to the first gate 610. The metal pattern 803 is connected to the vertical contacts 714 and 715 connected to the second N-type doping region 530 and the second P-type doping region 540, respectively. In addition, the metal pattern 801 is electrically connected to the second pad 20, and the metal patterns 802 and 803 are electrically connected to the middle node NM.

Therefore, the first N-type doping region 510 and the first P-type doping region 520 are electrically connected to the second pad 20, and the second N-type doping region 530, the second P-type doping region 540, and the first gate 610 are electrically connected to the middle node NM.

The N-type floating diffusion region 420 may be electrically floating.

When an ESD event occurs such that a plurality of positive charges flow in the SCR 1100a through the second pad 20, the SCR 1100a may be turned on to discharge the positive charges to the N-type LDMOS transistor 1200 through the middle node NM.

Figure 3:
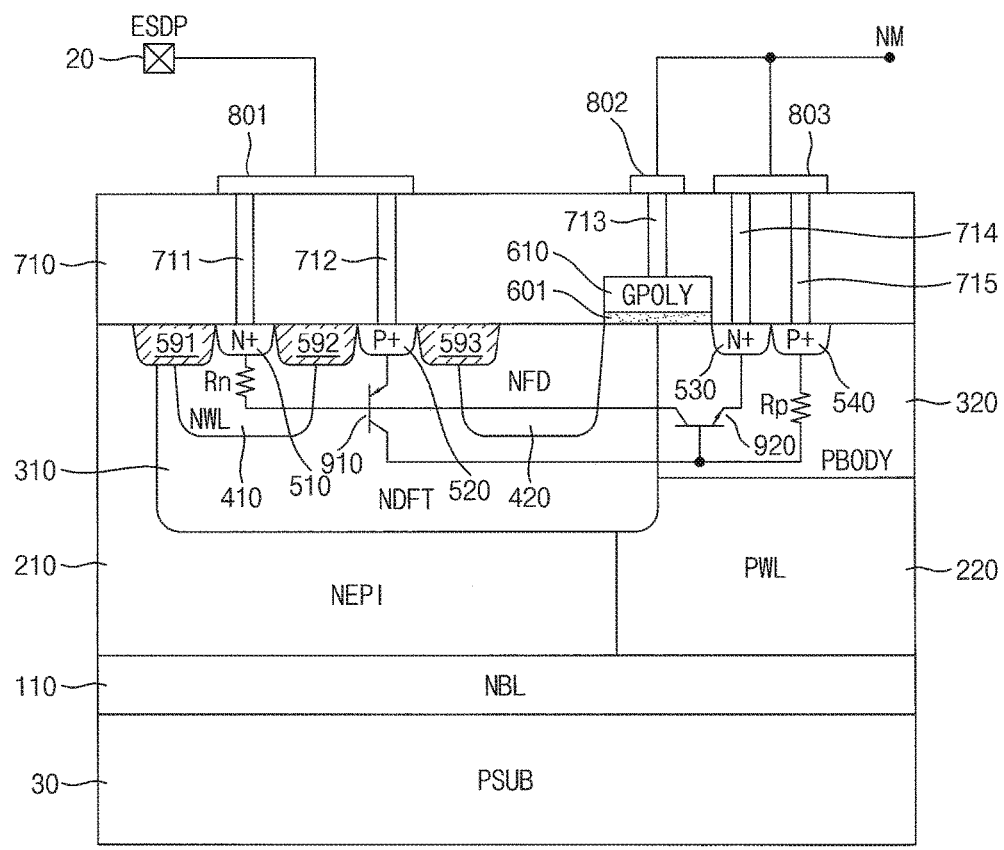
FIG. 3 is a diagram illustrating a bipolar junction transistor (BJT) parasitically formed in the SCR of FIG. 2.
Figure 4:
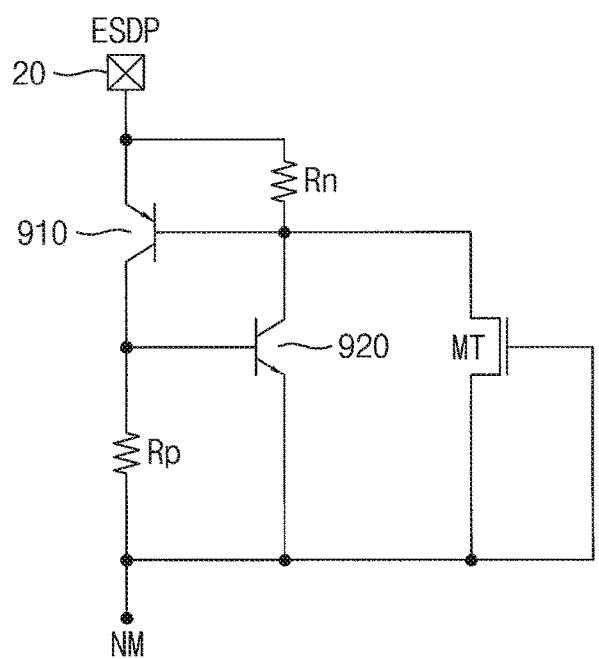
FIG. 4 is a circuit diagram illustrating an equivalent circuit of the SCR of FIG. 2.

FIG. 3 is a diagram illustrating a bipolar junction transistor (BJT) parasitically formed in the SCR of FIG. 2, and FIG. 4 is a circuit diagram illustrating an equivalent circuit of the SCR of FIG. 2.

Referring to FIG. 3, a PNP BJT 910 may be parasitically formed in the SCR 1100a. An emitter of the PNP BJT 910 may correspond to the first P-type doping region 520, a base of the PNP BJT 910 may correspond to the first N-type drift region 310, and a collector of the PNP BJT 910 may correspond to the P-type body region 320 and the second P-type doping region 540.

In addition, an NPN BJT 920 may be parasitically formed in the SCR 1100a. A collector of the NPN BJT 920 may correspond to the first N-type doping region 510, the first N-type well region 410, and the first N-type drift region 310, a base of the NPN BJT 920 may correspond to the P-type body region 320, and an emitter of the NPN BJT 920 may correspond to the second N-type doping region 530.

In FIG. 3, a resistance of the first N-type well region 410 and the first N-type drift region 310 is represented as an N-well resistor Rn, and a resistance of the P-type body region 320 is represented as a P-well resistor Rp.

Therefore, an equivalent circuit of the SCR 1100*a* of FIG. 2 may be represented as a circuit diagram of FIG. 4.

Hereinafter, an operation of the SCR 1100*a* will be described with reference to FIGS. 2 to 4.

When an ESD event occurs, a plurality of positive charges may flow in the SCR 1100*a* through the second pad 20. Because the positive charges are transferred to the first N-type well region 410 and the first N-type drift region 310, an electric potential of the first N-type well region 410 and the first N-type drift region 310 may increase as an amount of the positive charges flowing in the SCR 1100*a* through the second pad 20 increases. Therefore, the first N-type drift region 310 and the P-type body region 320 may be in a reverse biased state. When the electric potential of the first N-type drift region 310 increases such that an electric potential difference between the first N-type drift region 310 and the P-type body region 320 reaches a breakdown voltage, an avalanche breakdown may occur at a junction of the first N-type drift region 310 and the P-type body region 320.

When the avalanche breakdown occurs, electron-hole pairs may be generated, and holes of the electron-hole pairs may be transferred to the P-type body region 320 to increase an electric potential of the P-type body region 320. When the electric potential of the P-type body region 320 increases such that an electric potential difference between the P-type body region 320 and the second N-type doping region 530 becomes greater than a threshold voltage of the NPN BJT 920, the NPN BJT 920 may be turned on.

When the NPN BJT 920 is turned on, a current may flow from the second pad 20 to the middle node NM through the first N-type doping region 510, the first N-type well region 410, the first N-type drift region 310, the P-type body region 320, and the second N-type doping region 530. While the current flows through the first N-type drift region 310, a voltage drop may occur at the first N-type drift region 310 by the N-well resistor Rn. Therefore, the electric potential of the first N-type drift region 310 may become lower than an electrical potential of the first P-type doping region 520, such that the PNP BJT 910 may be turned on.

When the PNP BJT 910 is turned on, a current may flow from the second pad 20 to the middle node NM through the first P-type doping region 520, the first N-type drift region 310, the P-type body region 320, and the second P-type doping region 540. While the current flows through the P-type body region 320, a voltage drop may occur at the P-type body region 320 by the P-well resistor Rp. Therefore, the electric potential of the P-type body region 320 may be maintained higher than an electrical potential of the second N-type doping region 530, such that the NPN BJT 920 may be turned on more strongly.

As described above, when an ESD event occurs such that a plurality of positive charges flow in the SCR 1100*a* through the second pad 20, the PNP BJT 910 and the NPN BJT 920 may be maintained in a turned on state through a positive feedback. Therefore, when the ESD event occurs such that a plurality of positive charges flow in the SCR 1100*a* through the second pad 20, the SCR 1100*a* may be turned on to discharge the positive charges to the middle node NM.

In addition, the SCR 1100*a* according to example embodiments includes the first gate 610 disposed above a boundary area of the first N-type drift region 310 and the P-type body region 320 between the N-type floating diffusion region 420 and the second N-type doping region 530. Therefore, as illustrated in FIGS. 3 and 4, the N-type floating diffusion region 420, the second N-type doping region 530, and the first gate 610 may form a metal oxide semiconductor (MOS) transistor MT coupled to the NPN BJT 920 in parallel. Therefore, the breakdown voltage, at which an avalanche breakdown occurs at a junction of the first N-type drift region 310 and the P-type body region 320, may be similar to a breakdown voltage of the MOS transistor MT. As such, a triggering voltage of the SCR 1100*a* may decrease.

In addition, the SCR 1100*a* according to example embodiments includes the N-type floating diffusion region 420 disposed in first N-type drift region 310 corresponding to the base of the PNP BJT 910 and spaced apart from the first N-type well region 410 in a direction of the P-type body region 320. Therefore, a distance between the P-type body region 320 and the N-type floating diffusion region 420 may be smaller than a distance between the P-type body region 320 and the first N-type doping region 510. As such, when the NPN BJT 920 is turned on, a portion of the current, which flows from the second pad 20 to the middle node NM through the first N-type doping region 510, the first N-type well region 410, the first N-type drift region 310, the P-type body region 320, and the second N-type doping region 530, may be leaked to the N-type floating diffusion region 420, such that a current gain of the NPN BJT 920 may decrease. Because a holding voltage of the SCR 1100*a* is inversely proportional to the current gain of the NPN BJT 920, the holding voltage of the SCR 1100*a* may increase.

As described above with reference to FIGS. 2 to 4, when the ESD event occurs such that a plurality of positive charges flow in the SCR 1100*a* through the second pad 20, the SCR 1100*a* may effectively discharge the positive charges to the middle node NM while having a low triggering voltage and a high holding voltage.

As illustrated in FIG. 1, because the ESD protection device 1000 according to example embodiments further includes the N-type LDMOS transistor 1200 serially connected to the SCR 1100, the ESD protection device 1000 may have a higher holding voltage than the holding voltage of the SCR 1100*a* of FIG. 2.

Figure 5:
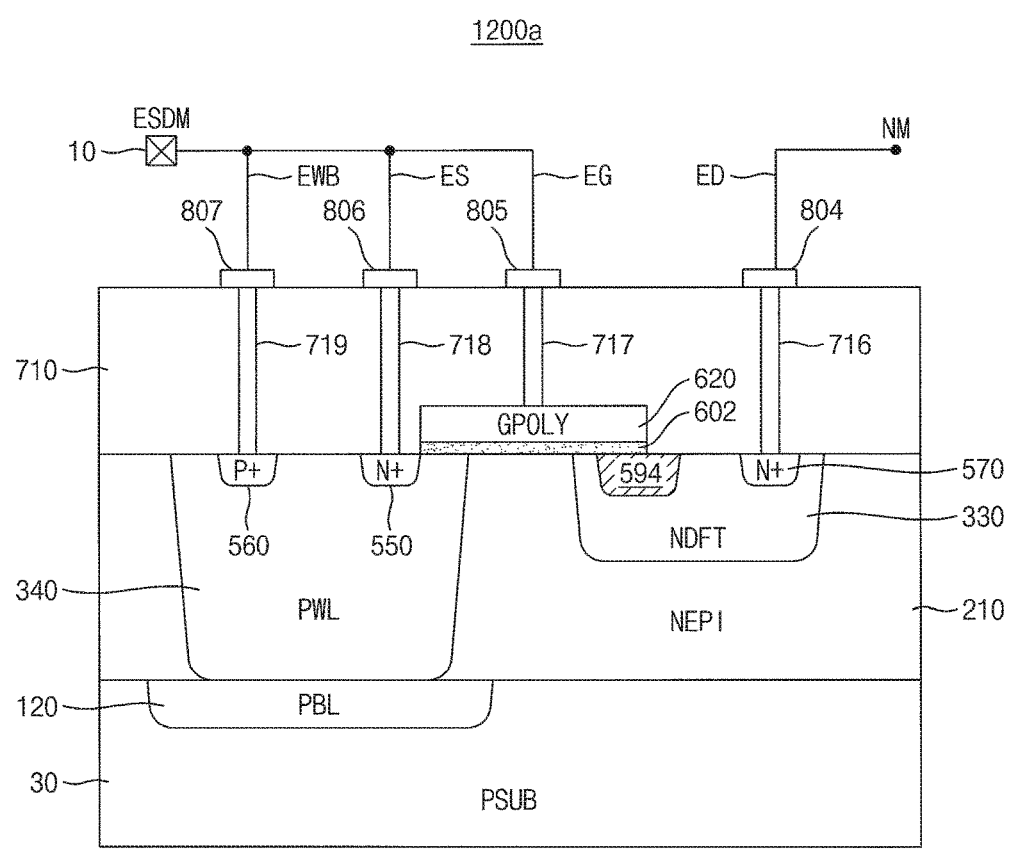
FIG. 5 is a cross-sectional diagram illustrating an example of an N-type laterally diffused metal oxide semiconductor (LDMOS) transistor included in the ESD protection device of FIG. 1.

FIG. 5 is a cross-sectional diagram illustrating an example of an N-type laterally diffused metal oxide semiconductor (LDMOS) transistor included in the ESD protection device of FIG. 1.

Referring to FIG. 5, an N-type LDMOS transistor 1200*a* includes a gate electrode EG including a second gate GPOLY 620, a source electrode ES including a third N-type doping region N+ 550 disposed in a second P-type well region PWL 340, a well bias electrode EWB including a third P-type doping region P+ 560 disposed in the second P-type well region 340, and a drain electrode ED including a fourth N-type doping region N+ 570 disposed in a second N-type drift region NDFT 330.

As illustrated in FIG. 5, the source electrode ES, the gate electrode EG, and the well bias electrode EWB are electrically connected to the first pad 10, and the drain electrode ED is electrically connected to the middle node NM. Therefore, the N-type LDMOS transistor 1200*a* is coupled between the first pad 10 and the middle node NM in a gate-grounded structure.

In one or more example embodiments, a gate dielectric layer 602 such as an oxide layer is disposed on an upper surface of a portion of the second N-type drift region 330 and a portion of the second P-type well region 340, and a conduction layer such as a poly-silicon layer may be deposited on the gate dielectric layer 602. The second gate 620 may be formed by patterning the poly-silicon layer. The second gate 620 may be formed of various conductive materials such as metal, poly-silicon, a combination of metal and poly-silicon, etc. An insulation structure may be further disposed at both side walls of the second gate 620.

An isolation structure 594 for isolating the second gate 620 from the fourth N-type doping region 570 is disposed in the second N-type drift region 330.

The N-type LDMOS transistor 1200a includes the semiconductor substrate 30. In one or more example embodiments, the SCR 1100a of FIG. 2 and the N-type LDMOS transistor 1200a of FIG. 5 may be formed on the same semiconductor substrate 30.

The second N-type drift region 330 and the second P-type well region 340 are disposed in the N-type epitaxial layer 210 that may be grown on the semiconductor substrate 30.

A P-type buried later PBL 120 is disposed in an upper portion of the semiconductor substrate 30. For example, the P-type buried later 120 may be formed by performing an ion-implanting process with a P-type dopant on the semiconductor substrate 30. The second P-type well region 340 is disposed deep in the N-type epitaxial layer 210 to contact the P-type buried layer 120.

As illustrated in FIG. 5, the drain electrode ED includes a vertical contact 716 penetrating the interlayer dielectric bulk 710 and a metal pattern 804, the gate electrode EG includes a vertical contact 717 penetrating the interlayer dielectric bulk 710 and a metal pattern 805, the source electrode ES includes a vertical contact 718 penetrating the interlayer dielectric bulk 710 and a metal pattern 806, and the well bias electrode EWB includes a vertical contact 719 penetrating the interlayer dielectric bulk 710 and a metal pattern 807. The metal patterns 804, 805, 806, and 807 are disposed on an upper surface of the interlayer dielectric bulk 710.

Figure 6:
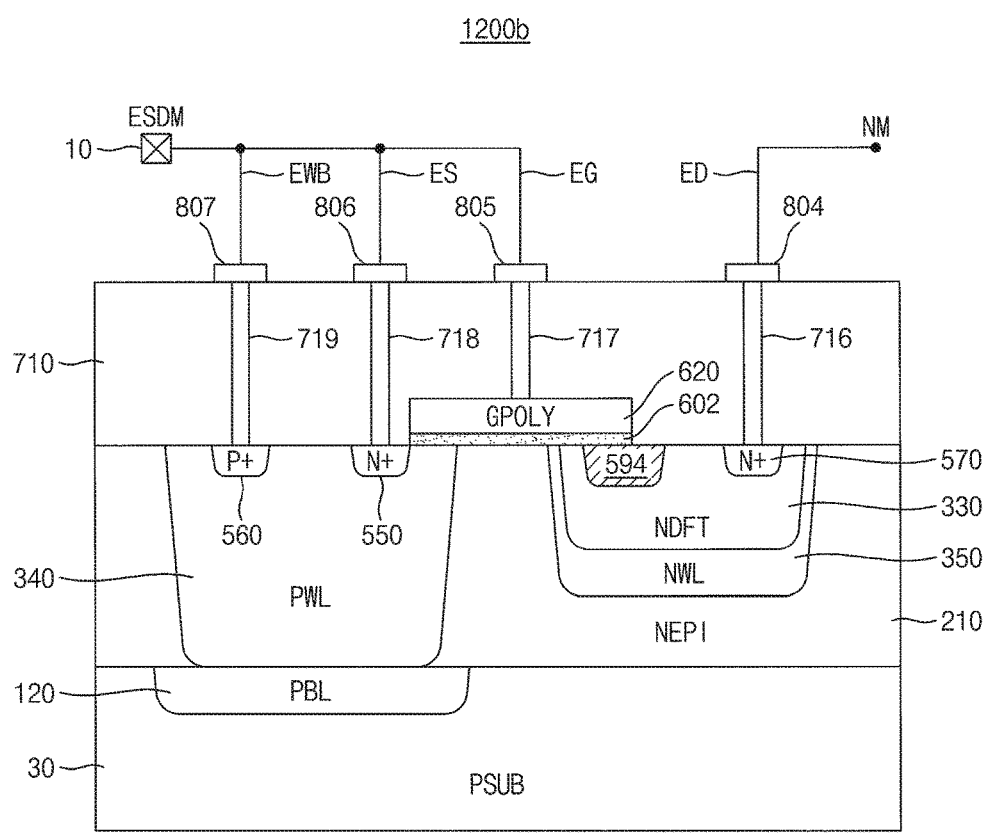
FIG. 6 is a cross-sectional diagram illustrating another example of an N-type LDMOS transistor included in the ESD protection device of FIG. 1.

FIG. 6 is a cross-sectional diagram illustrating another example of an N-type LDMOS transistor included in the ESD protection device of FIG. 1.

An N-type LDMOS transistor 1200b of FIG. 6 is similar to the N-type LDMOS transistor 1200a of FIG. 5. Therefore, repeated descriptions will be omitted, and only the differences will be described.

Referring to FIG. 6, the N-type LDMOS transistor 1200b further includes a second N-type well region NWL 350 disposed in the N-type epitaxial layer 210. The second N-type drift region 330 is disposed in the second N-type well region 350. In one or more example embodiments, an impurity concentration of the second N-type well region 350 may be lower than an impurity concentration of the second N-type drift region 330. By further including the second N-type well region 350, a breakdown voltage of the N-type LDMOS transistor 1200b of FIG. 6 may be increased compared to a breakdown voltage of the N-type LDMOS transistor 1200a of FIG. 5.

An example embodiment of FIG. 6 may be adopted to implement the same impurity concentration with respect to a plurality of drift regions respectively included in LDMOS transistors having different breakdown voltages that are formed on the same semiconductor substrate.

Figure 7:
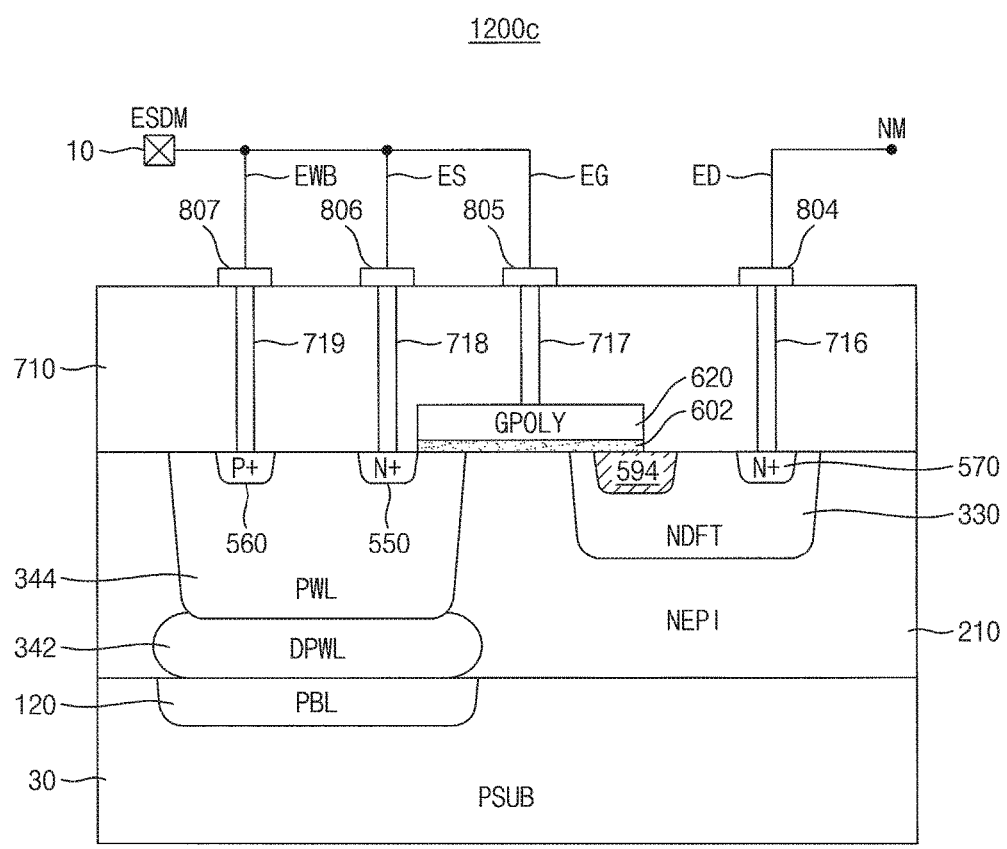
FIG. 7 is a cross-sectional diagram illustrating still another example of an N-type LDMOS transistor included in the ESD protection device of FIG. 1.

FIG. 7 is a cross-sectional diagram illustrating still another example of an N-type LDMOS transistor included in the ESD protection device of FIG. 1.

An N-type LDMOS transistor 1200c of FIG. 7 is similar to the N-type LDMOS transistor 1200a of FIG. 5. Therefore, repeated descriptions will be omitted, and only the differences will be described.

Referring to FIG. 7, the N-type LDMOS transistor 1200c further includes a P-type deep well region DPWL 342 disposed on the P-type buried later 120. The second P-type well region 344 is disposed to a depth to contact the P-type deep well region 342.

An example embodiment of FIG. 7 may be adopted to implement a plurality of P-type well regions having the same depth, in the bipolar-CMOS-DMOS process for integrating various elements together using the same semiconductor substrates.

Although examples of a structure of the N-type LDMOS transistor 1200 included in the ESD protection device 1000 are described above with reference to FIGS. 5 to 7, example embodiments are not limited thereto. According to example embodiments, the N-type LDMOS transistor 1200 may be implemented in various structures.

Figure 8:
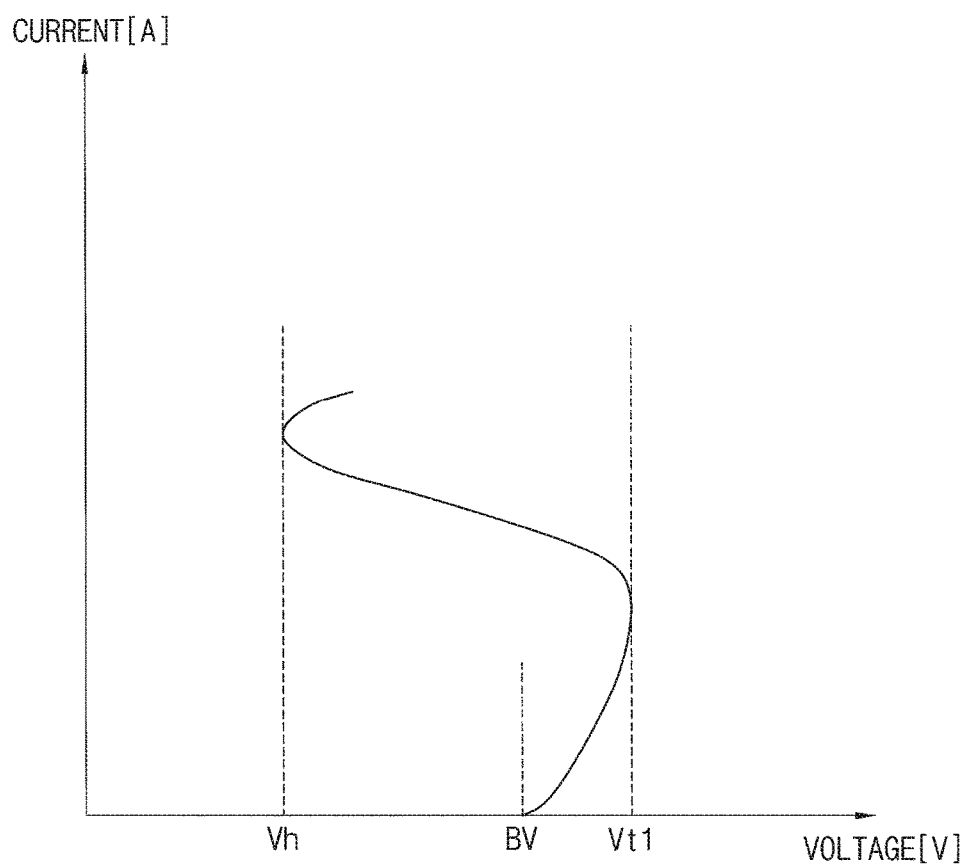
FIG. 8 is a graph illustrating voltage-current characteristics of an N-type LDMOS transistor included in the ESD protection device of FIG. 1.

FIG. 8 is a graph illustrating voltage-current characteristics of an N-type LDMOS transistor included in the ESD protection device of FIG. 1.

In FIG. 8, an x-axis represents a voltage difference between the drain electrode ED and the source electrode ES of the N-type LDMOS transistor 1200, and a y-axis represents a current flowing from the drain electrode ED of the N-type LDMOS transistor 1200 through the N-type LDMOS transistor 1200.

As illustrated in FIG. 8, when a voltage higher than a breakdown voltage BV is applied between the drain electrode ED and the source electrode ES of the N-type LDMOS transistor 1200, a current starts flowing through the N-type LDMOS transistor 1200. When a voltage corresponding to a triggering voltage Vt1 is applied between the drain electrode ED and the source electrode ES of the N-type LDMOS transistor 1200, the parasitic BJTs 910 and 920 may be turned on, and a snapback occurs, such that the voltage difference between the drain electrode ED and the source electrode ES of the N-type LDMOS transistor 1200 decreases and is maintained above a holding voltage Vh.

Figure 9:
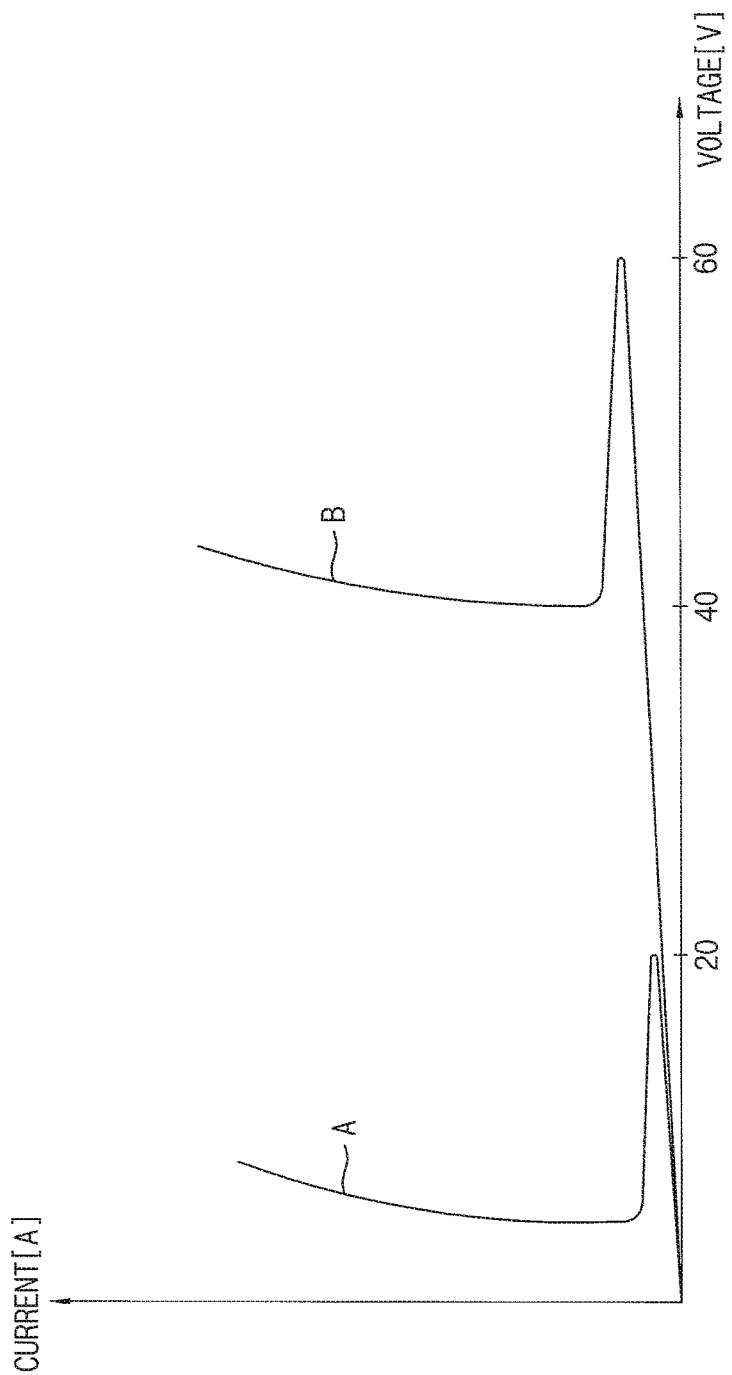
FIG. 9 is a graph illustrating voltage-current characteristics of the ESD protection device of FIG. 1.

FIG. 9 is a graph illustrating voltage-current characteristics of the ESD protection device of FIG. 1.

In FIG. 9, an x-axis represents a voltage difference between the first pad 10 and the second pad 20, and a y-axis represents a current flowing from the second pad 20 through the ESD protection device 1000.

In FIG. 9, a first graph A represents voltage-current characteristics of a conventional SCR, and a second graph B represents voltage-current characteristics of the ESD protection device 1000 of FIG. 1.

A semiconductor device operating using a high voltage, such as a power management integrated circuit (PMIC), receives a voltage having tens of volts through an input/output pad and/or a supply voltage pad.

However, as illustrated in FIG. 9, the conventional SCR may generally have a triggering voltage and a holding voltage lower than 20V. Therefore, the conventional SCR may not be used in a semiconductor device operating using a high voltage.

On the other hand, as described above with reference to FIGS. 1 to 8, the ESD protection device 1000 according to example embodiments includes the SCR 1100 having a high holding voltage and the N-type LDMOS transistor 1200 of the gate-grounded structure serially connected to the SCR 1100.

Therefore, a holding voltage of the ESD protection device 1000 may correspond to a sum of a holding voltage of the SCR 1100 and a holding voltage of the N-type LDMOS transistor 1200. As such, the holding voltage of the ESD protection device 1000 may be effectively increased.

For example, as illustrated in FIG. 9, the ESD protection device 1000 according to example embodiments may have a triggering voltage of about 60V and a holding voltage of about 40V.

Figure 10:
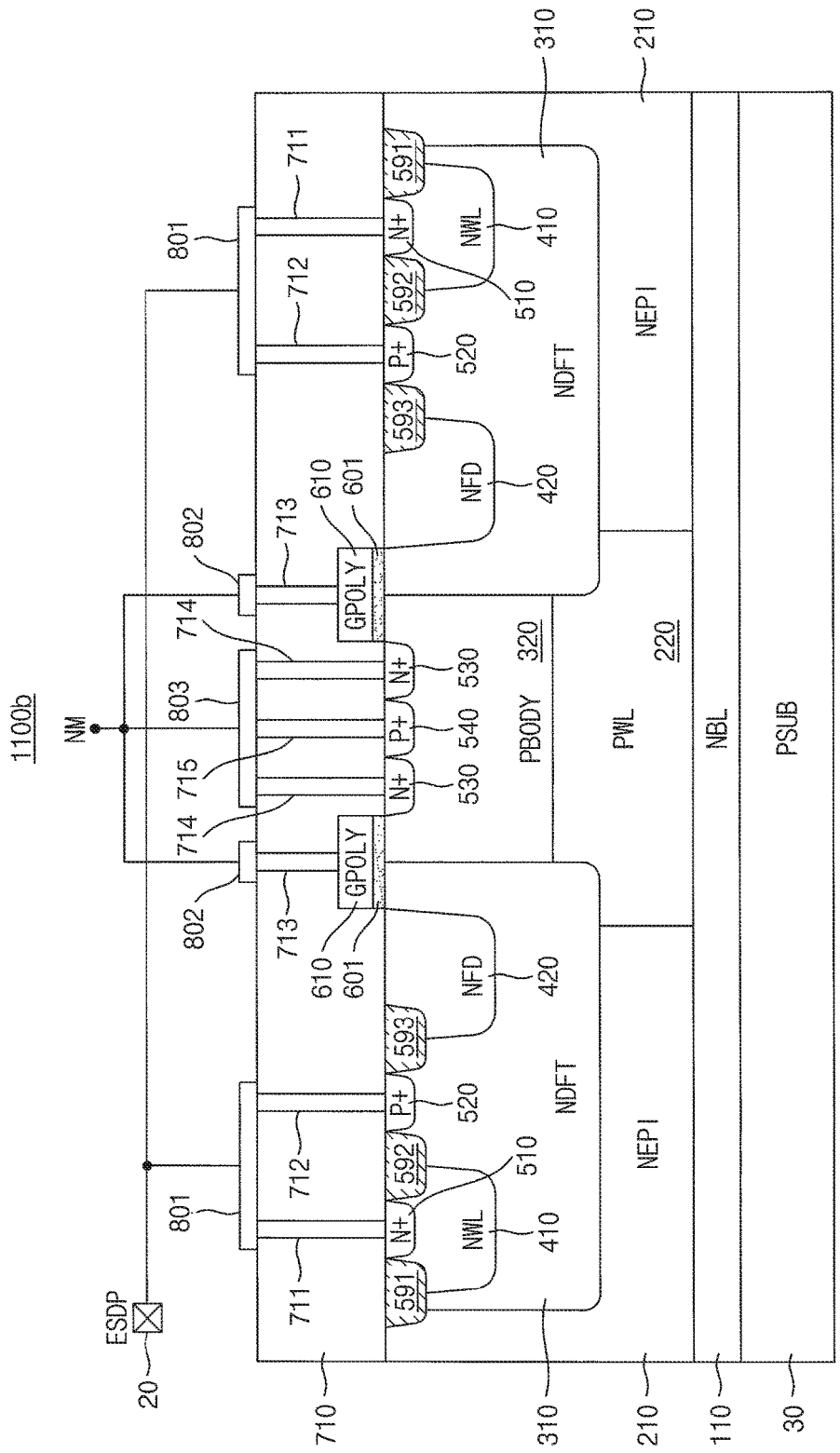
FIG. 10 is a cross-sectional diagram illustrating another example of a SCR included in the ESD protection device of FIG. 1.

FIG. 10 is a cross-sectional diagram illustrating another example of a SCR included in the ESD protection device of FIG. 1.

An SCR 1100b of FIG. 10 corresponds to the SCR 1100a of FIG. 2 that is implemented in a multi-finger structure. Therefore, repeated descriptions will be omitted, and only the differences will be described.

Referring to FIG. 10, the SCR 1100b may have a symmetrical structure with respect to the second P-type doping region 540. That is, elements located to the left of the second P-type doping region 540 are the same as the elements located to the right of the second P-type doping region 540. Therefore, elements disposed in the first N-type drift region 310 located to the left of the P-type body region 320 and elements disposed in the first N-type drift region 310 located to the right of the P-type body region 320 may share elements disposed in the P-type body region 320 in an operation of the SCR 1100b.

Figure 11:
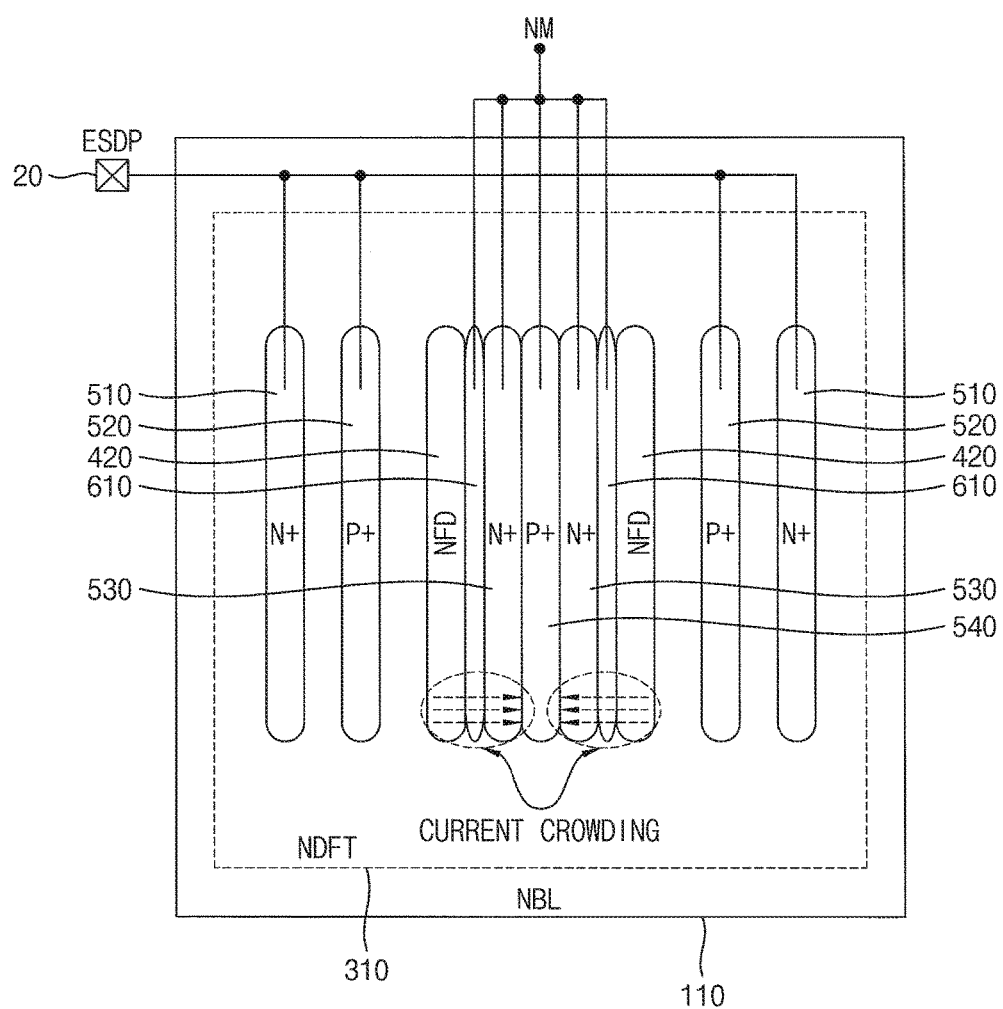
FIG. 11 is a plan diagram illustrating an example of the SCR of FIG. 10.

FIG. 11 is a plan diagram illustrating an example of the SCR of FIG. 10.

Referring to FIGS. 10 and 11, the first N-type doping region 510 and the first P-type doping region 520, which are electrically connected to the second pad 20, the second N-type doping region 530, the second P-type doping region 540, and the first gate 610, which are electrically connected to the middle node NM, and the N-type floating diffusion region 420 are disposed in a bar pattern.

As described above with reference to FIGS. 2 to 4, when an ESD event occurs, a current flowing in the SCR 1100b through the second pad 20 may flow from the N-type floating diffusion region 420 to the second N-type doping region 530 and the second P-type doping region 540.

As illustrated in FIG. 11, because the N-type floating diffusion region 420, the second N-type doping region 530, and the second P-type doping region 540 are formed in the bar pattern, the current may not uniformly flow from the N-type floating diffusion region 420 to the second N-type doping region 530 and the second P-type doping region 540, and a current crowding, in which the current flows intensively at an edge of the bar pattern, may occur. In this case, an ESD level of the SCR 1100b may decrease.

Figure 12:
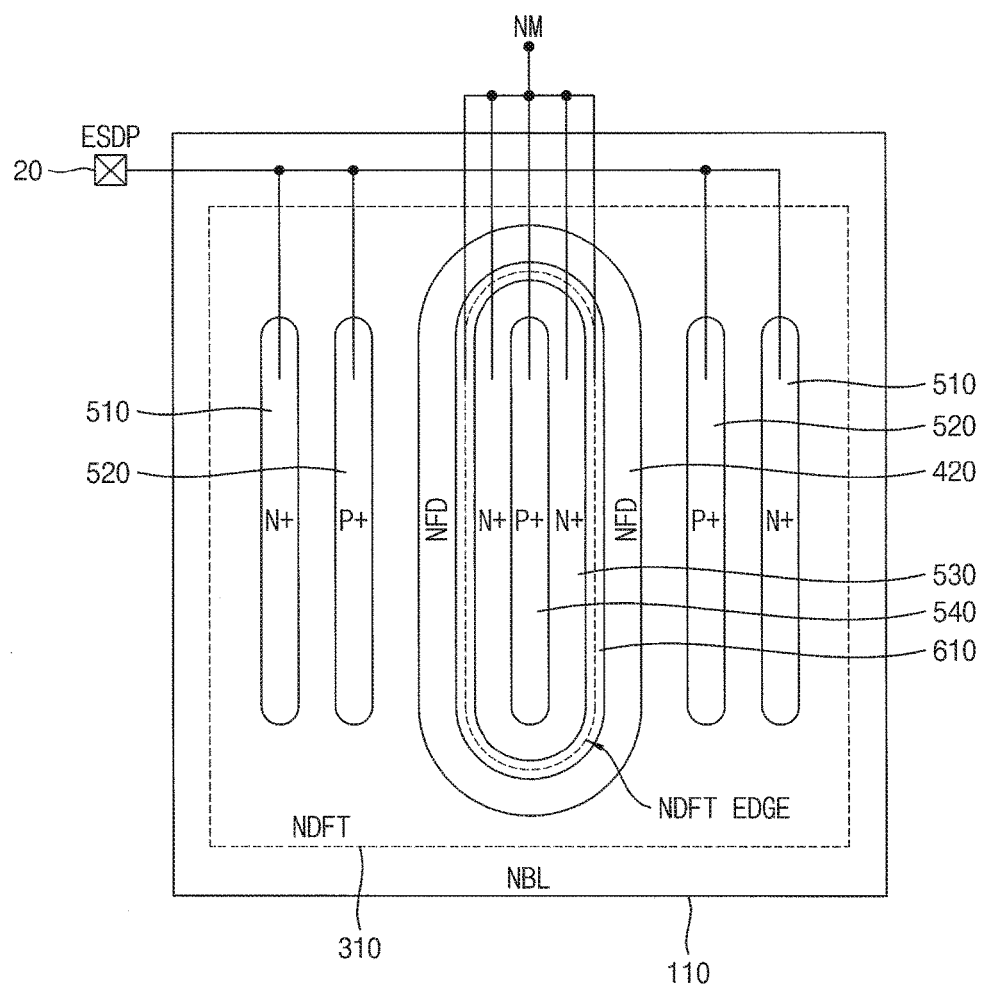
FIG. 12 is a plan diagram illustrating another example of the SCR of FIG. 10.

FIG. 12 is a plan diagram illustrating another example of the SCR of FIG. 10.

Referring to FIGS. 10 and 12, the N-type floating diffusion region 420, the first gate 610, the second N-type doping region 530, and the second P-type doping region 540 are disposed in a track pattern.

That is, the second N-type doping region 530 surrounds the second P-type doping region 540 in a track pattern, the first gate 610 surrounds the second N-type doping region 530 in a track pattern, and the N-type floating diffusion region 420 surrounds the first gate 610 in a track pattern.

In this case, as illustrated in FIGS. 10 and 12, a boundary or edge of the first N-type drift region 310 may be disposed at a center of the first gate 610 having a track pattern.

Therefore, when an ESD event occurs, the current flowing in the SCR 1100b through the second pad 20 may uniformly flow from the N-type floating diffusion region 420 to the second N-type doping region 530 and the second P-type doping region 540 without incurring the current crowding, which is described above with reference to FIG. 11.

Therefore, the ESD level of the SCR 1100b may effectively increase.

Figure 13:
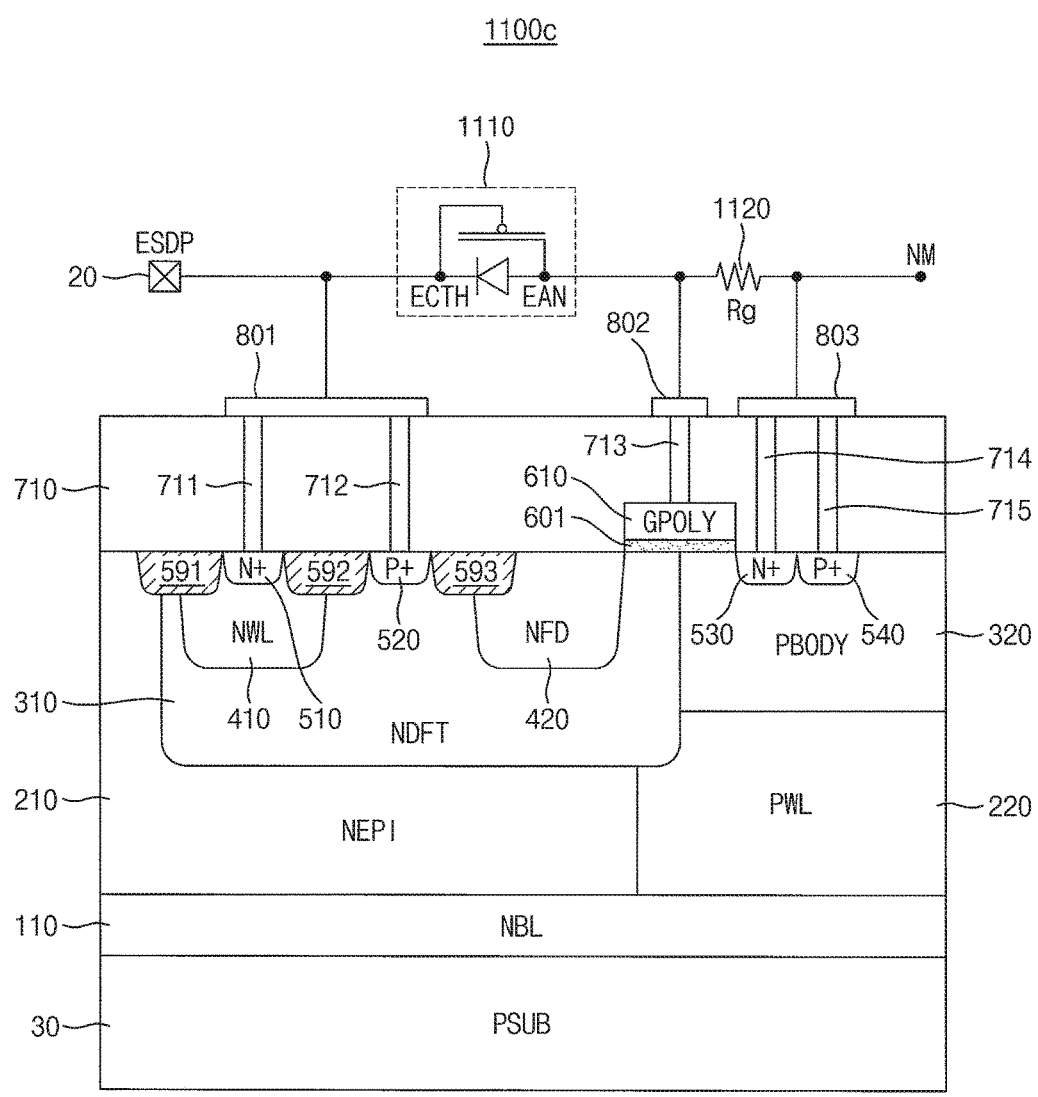
FIG. 13 is a cross-sectional diagram illustrating still another example of a SCR included in the ESD protection device of FIG. 1.
Figure 14:
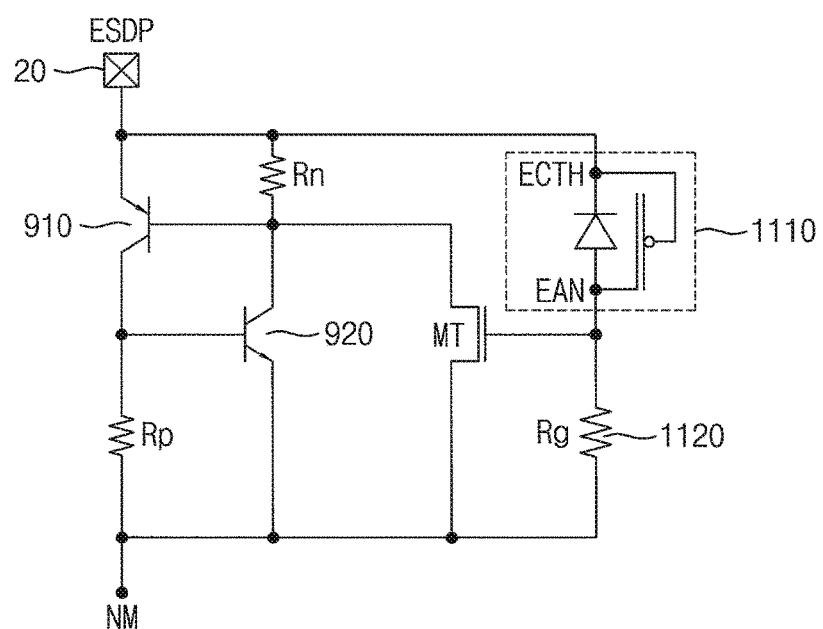
FIG. 14 is a circuit diagram illustrating an equivalent circuit of the SCR of FIG. 13.

FIG. 13 is a cross-sectional diagram illustrating still another example of a SCR included in the ESD protection device of FIG. 1, and FIG. 14 is a circuit diagram illustrating an equivalent circuit of the SCR of FIG. 13.

An SCR 1100c of FIG. 13 is the same as the SCR 1100a of FIG. 2 except that the SCR 1100c of FIG. 13 further includes an LDMOS transistor based diode 1110 and a resistor Rg 1120. Therefore, repeated descriptions will be omitted, and only the differences will be described.

In FIGS. 13 and 14, an example embodiment of the SCR 1100c in which the LDMOS transistor based diode 1110 and the resistor 1120 are used for a gate coupling of the SCR 1100a is illustrated.

In detail, a cathode electrode ECTH of the diode 1110 is electrically connected to the second pad 20, and an anode electrode EAN of the diode 1110 is electrically connected to the first gate 610. The resistor 1120 is connected between the anode electrode EAN and the middle node NM.

Figure 15:
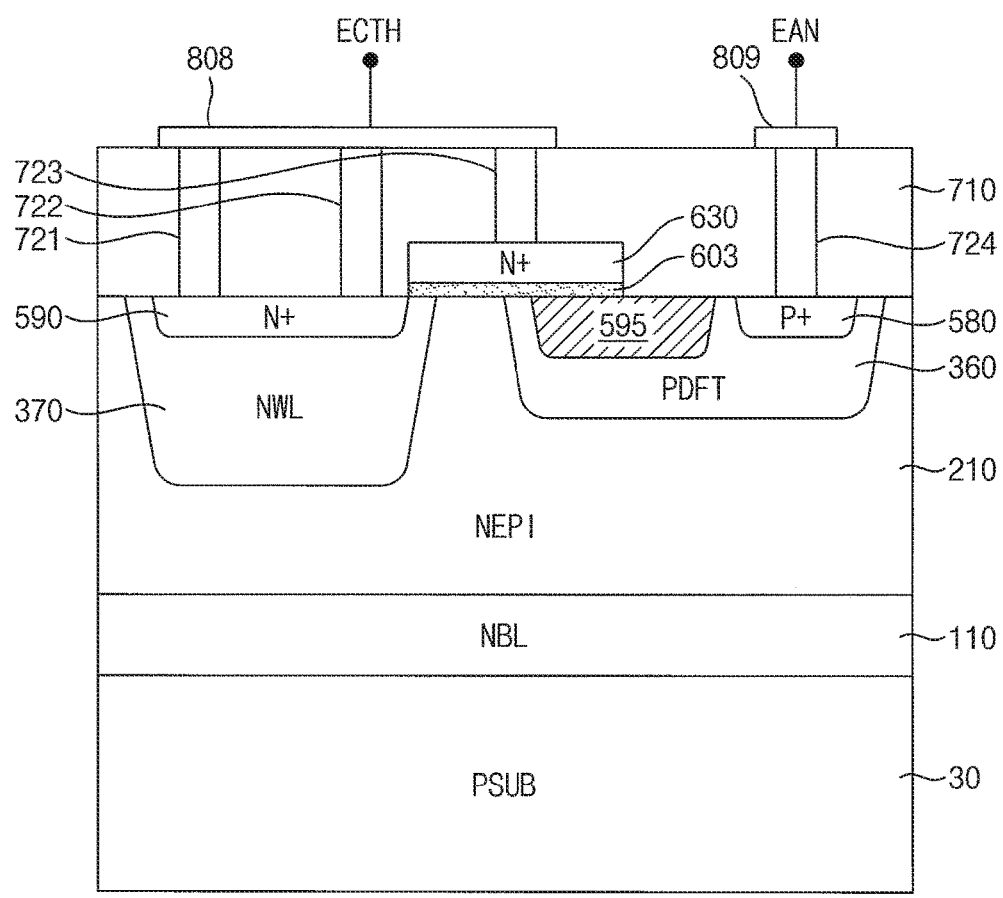
FIG. 15 is a cross-sectional diagram illustrating an example of an LDMOS transistor based diode included in the SCR of FIG. 13.

FIG. 15 is a cross-sectional diagram illustrating an example of an LDMOS transistor based diode included in the SCR of FIG. 13.

Referring to FIG. 15, a diode 1110a includes the cathode electrode ECTH and the anode electrode EAN. Here, the electrodes may include doping regions 580 and 590 alone, or the electrodes may include vertical contacts 721, 722, 723, and 724 and/or metal patterns 808 and 809 in addition to the doping regions 580 and 590. One electrode may include one or more structures forming an equipotential assembly.

The cathode electrode ECTH includes at least a fifth N-type doping region N+ 590 disposed in a third N-type well region NWL 370, and a third gate N+ 630. The anode electrode EAN includes at least a fourth P-type doping region P+ 580 disposed in a P-type drift region PDFT 360. As will be described later with reference to FIGS. 16 and 17, the diode 1110a may have a structure based on a P-type LDMOS transistor.

In other words, the diode 1110a may be formed by modifying only a portion of the LDMOS transistor, and the design rule and the structure of the LDMOS transistor may be applied to the diode 1110a without a modification. FIG. 15 illustrates the diode 1110a adopting the structure of the P-type LDMOS transistor. The third gate 630, the third N-type well region 370, the P-type drift region 360, and the fourth P-type doping region 580 may be substantially the same as those of the P-type LDMOS transistor.

The third gate 630 and the fifth N-type doping region 590 included in the cathode electrode ECTH may be electrically connected to each other through the vertical contacts 721, 722, and 723 and the metal pattern 808 coupled to the vertical contacts 721, 722, and 723. Each of the vertical contacts 721, 722, and 723 may be implemented with a via penetrating the interlayer dielectric bulk 710. Through such connections, the third gate 630 and the fifth N-type doping region 590 may form an equipotential assembly. The number of the vertical contacts connecting the fifth N-type doping region 590 and the metal pattern 808 and the number of the vertical contacts connecting the third gate 630 and the metal pattern 808 may be varied.

In one or more example embodiments, the third gate 630 may be doped with an N-type dopant. For example, the third gate 630 and the fifth N-type doping region 590 included in the cathode electrode ECTH may be doped simultaneously with the same N-type dopant.

An isolation structure 595 may be disposed in the P-type drift region 360 between the third gate 630 and the fourth P-type doping region 580. The isolation structure 595 may be formed through the STI process. The isolation structure 595 may isolate the third gate 630 and the fourth P-type doping region 580 to reduce electrical interaction between the third gate 630 receiving a high voltage and the fourth P-type doping region 580.

In one or more example embodiments, a gate dielectric layer 603 such as an oxide layer may be disposed on an upper surface of a portion of the third N-type well region 370 and a portion of the P-type drift region 360, and a conduction layer such as a poly-silicon layer may be deposited on the gate dielectric layer 603. The third gate 630 may be formed by patterning the poly-silicon layer. The third gate 630 may be formed of various conductive materials such as metal, poly-silicon, a combination of metal and poly-silicon, etc. An insulation structure may be further disposed at both side walls of the third gate 630.

The diode 1110a includes the semiconductor substrate 30. In one or more example embodiments, the diode 1110a and the SCR 1100a of FIG. 2 may be formed on the same semiconductor substrate 30 to implement the SCR 1100c.

The N-type buried later NBL 110 is disposed on an upper portion of the semiconductor substrate 30, and an N-type epitaxial layer NEPI 210 is disposed on an upper portion of the N-type buried later 110. The third N-type well region 370 and the P-type drift region 360 are disposed in the N-type epitaxial layer 210.

Figure 16:
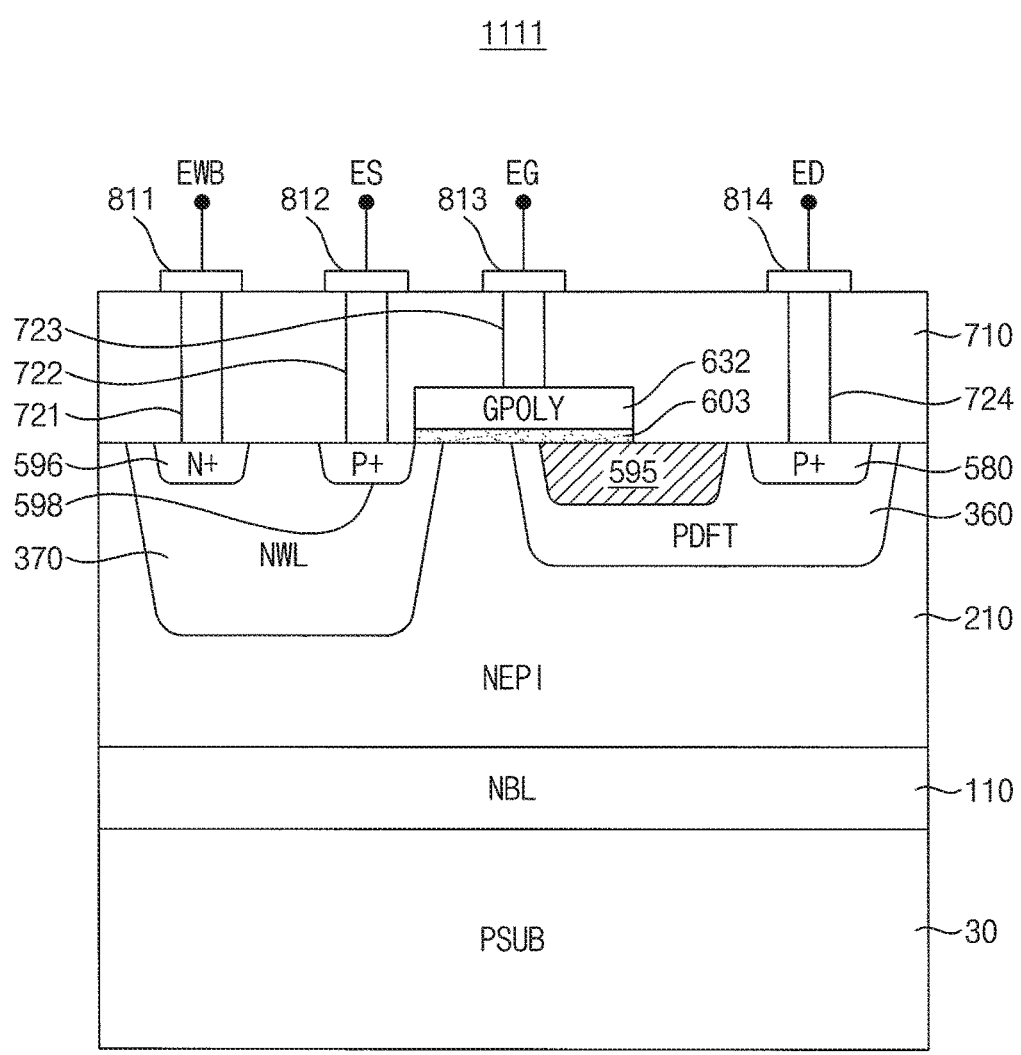
FIG. 16 is a cross-sectional diagram illustrating a P-type LDMOS transistor.
Figure 17:
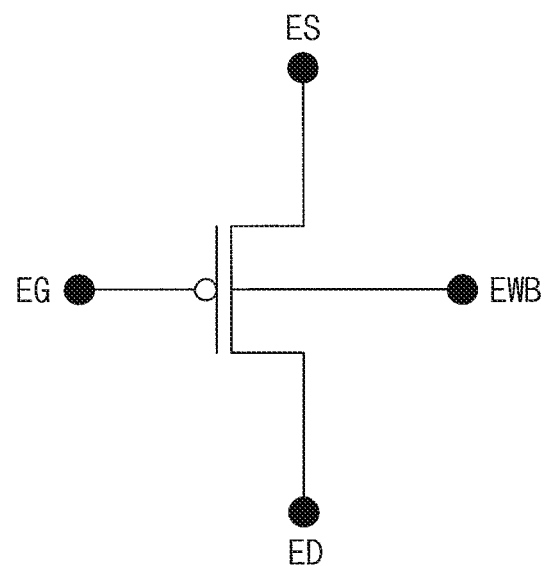
FIG. 17 is a circuit diagram illustrating an equivalent circuit of the P-type LDMOS transistor of FIG. 16.

FIG. 16 is a cross-sectional diagram illustrating a P-type LDMOS transistor, and FIG. 17 is a circuit diagram illustrating an equivalent circuit of the P-type LDMOS transistor of FIG. 16.

Referring to FIGS. 16 and 17, a P-type LDMOS transistor 1111 includes a well bias electrode EWB, a source electrode ES, a gate electrode EG, and a drain electrode ED.

The well bias electrode EWB includes at least a well bias region N+ 596 disposed in the third N-type well region 370. The source electrode ES includes at least a source region P+ 598 disposed in the third N-type well region 370. The gate electrode EG includes at least a fourth gate GPOLY 632. The drain electrode ED includes at least a drain region P+ 580 disposed in the P-type drift region 360.

Comparing the diode 1110a of FIG. 15 and the P-type LDMOS transistor 1111 of FIG. 16, the fourth P-type doping region 580 of the diode 1110a may correspond to the drain region 580 of the P-type LDMOS transistor 1111. The fifth N-type doping region 590 of the diode 1110a may correspond to an extended well bias region that is formed by removing the source region 598 of the P-type LDMOS transistor 1111 and extending the well bias region 596 of the P-type LDMOS transistor 1111.

In the P-type LDMOS transistor 1111, the vertical contacts 721, 722, and 723 may be connected to metal patterns 811, 812, and 813, respectively, because the well bias region 596, the source region 598, and the fourth gate 632 may not need to be electrically coupled with each other. The drain electrode ED may include the drain region 580 together with the vertical contact 724 and a metal pattern 814.

As described above with reference to FIGS. 15 to 17, the LDMOS transistor based diode 1110a may be implemented efficiently by adopting the design rule and the structure of the LDMOS process. In addition, the LDMOS transistor based diode 1110a may have a relatively high breakdown voltage as the LDMOS transistor.

Figure 18:
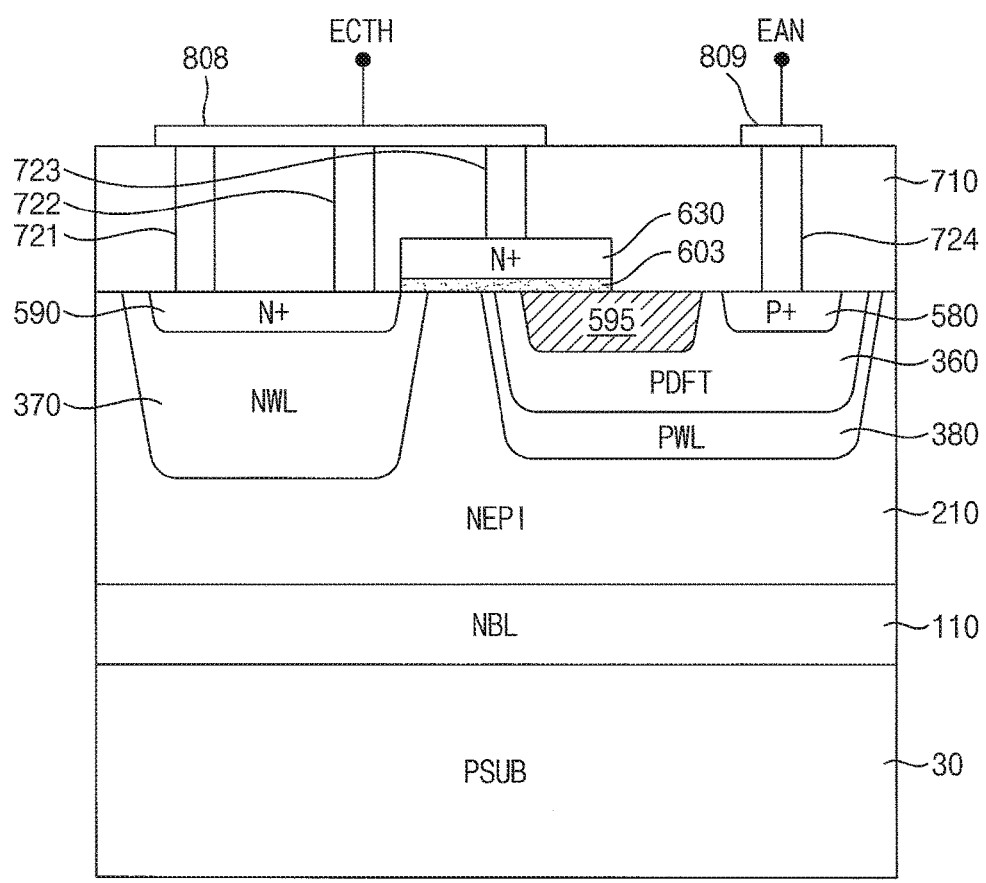
FIG. 18 is a cross-sectional diagram illustrating another example of an LDMOS transistor based diode included in the SCR of FIG. 13.

FIG. 18 is a cross-sectional diagram illustrating another example of an LDMOS transistor based diode included in the SCR of FIG. 13.

A diode 1110b of FIG. 18 is similar to the diode 1110a of FIG. 15. Therefore, repeated descriptions will be omitted, and only the differences will be described.

Referring to FIG. 18, the diode 1110b further includes a third P-type well region PWL 380 disposed in the N-type epitaxial layer 210. The P-type drift region 360 is disposed in the third P-type well region 380. In one or more example embodiments, an impurity concentration of the third P-type well region 380 may be lower than an impurity concentration of the P-type drift region 360.

By further including the third P-type well region 380, a breakdown voltage of the diode 1110b of FIG. 18 may be increased compared to a breakdown voltage of the diode 1110a of FIG. 15.

Referring again to FIGS. 13 and 14, the resistor 1120 is electrically connected between the first gate 610 and the middle node NM. Materials such as polysilicon may form the resistor 1120, or a passive resistor element may be used as the resistor 1120.

As illustrated in FIGS. 13 and 14, the SCR 1100c may have a gate coupling scheme through the diode 1110 and the resistor 1120.

Therefore, when a voltage lower than a breakdown voltage of the diode 1110 is applied to the second pad 20 by an ESD event, the diode 1110 may apply, to the first gate 610, an induction voltage that is determined by a junction capacitance, that is, a capacitance between the cathode electrode ECTH and the anode electrode EAN of the diode 1110. Therefore, a triggering voltage of the SCR 1100c may decrease due to a gate coupling caused by the diode 1110 and the resistor 1120. As such, the SCR 1100c may be turned on from the initial stage of the ESD event to discharge the positive charges flown through the second pad 20 to the middle node NM.

In addition, when a voltage higher than the breakdown voltage of the diode 1110 is applied to the second pad 20 by an ESD event, the diode 1110 may be turned on reversely by a breakdown operation such that the diode 1110 may apply, to the first gate 610, a division voltage that is determined by a ratio of a resistance of the resistor 1120 and a reverse-on-state resistance of the diode 1110. Therefore, the gate coupling may be accelerated during the ESD, and the SCR 1100c may maintain a small turn-on resistance.

Figure 19:
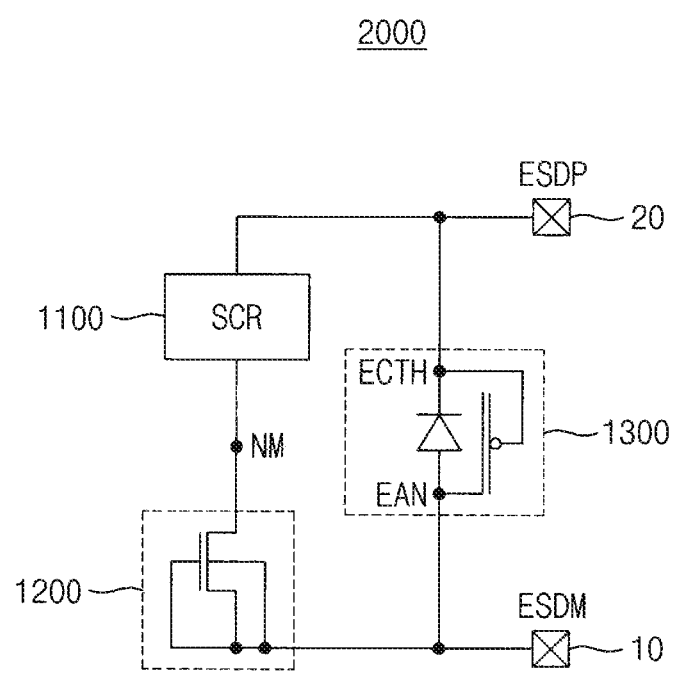
FIG. 19 is a block diagram illustrating an ESD protection device according to example embodiments.

FIG. 19 is a block diagram illustrating an ESD protection device according to example embodiments.

An ESD protection device 2000 of FIG. 19 is the same as the ESD protection device 1000 of FIG. 1 except that the ESD protection device 2000 of FIG. 19 further includes a shunting diode 1300. Therefore, repeated descriptions will be omitted, and only the differences will be described.

Referring to FIG. 19, the shunting diode 1300 is coupled between the first pad 10 and the second pad 20. The shunting diode 1300 includes an anode electrode EAN connected to the first pad 10 and a cathode electrode ECTH connected to the second pad 20.

The shunting diode 1300 may have the same structure as the LDMOS transistor based diode 1110 included in the SCR 1100c of FIG. 13. That is, the shunting diode 1300 may be implemented with one among the LDMOS transistor based diode 1110a of FIG. 15 and the LDMOS transistor based diode 1110b of FIG. 18.

A structure and an operation of the LDMOS transistor based diode 1110a of FIG. 15 and the LDMOS transistor based diode 1110b of FIG. 18 are described above with reference to FIGS. 15 to 18. Therefore, detailed description about a structure of the shunting diode 1300 will be omitted here.

When the ESD protection device 1000 of FIG. 1 is turned on by an ESD event, an on-state resistance of the ESD protection device 1000 between the first pad 10 and the second pad 20 may correspond to a sum of an on-state resistance of the SCR 1100 and an on-state resistance of the N-type LDMOS transistor 1200.

On the other hand, the ESD protection device 2000 further includes the shunting diode 1300 coupled between the first pad 10 and the second pad 20. Therefore, when the ESD protection device 2000 of FIG. 19 is turned on by an ESD event, an on-state resistance of the ESD protection device 2000 between the first pad 10 and the second pad 20 may be lower than the on-state resistance of the ESD protection device 1000 between the first pad 10 and the second pad 20, because of the shunting diode 1300. As such, an ESD performance of the ESD protection device 2000 may be further increased.

Figure 20:
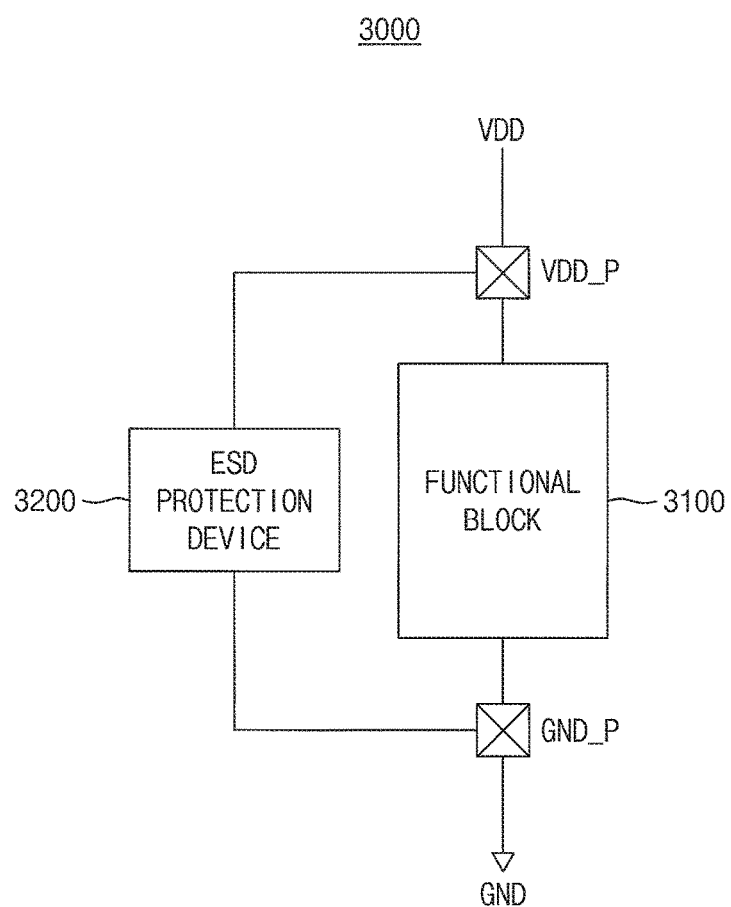
FIG. 20 is a block diagram illustrating an electronic device according to example embodiments.

FIG. 20 is a block diagram illustrating an electronic device according to example embodiments.

Referring to FIG. 20, an electronic device 3000 includes a functional block 3100 and an ESD protection device 3200.

The functional block 3100 is coupled between a supply voltage pad VDD_P coupled to a supply voltage VDD, and a ground voltage pad GND_P coupled to a ground voltage GND. The functional block 3100 operates using the supply voltage VDD. In one or more example embodiments, the functional block 3100 may include at least one among an application processor, a data input/output circuit, a logic circuit, a memory device, and a PMIC.

The ESD protection device 3200 is coupled between the supply voltage pad VDD_P and the ground voltage pad GND_P. When an ESD event occurs such that a plurality of positive charges flow in the ESD protection device 3200 through the supply voltage pad VDD_P, the ESD protection device 3200 may be turned on to discharge the positive charges to the ground voltage pad GND_P.

The ESD protection device 3200 may be implemented with one among the ESD protection device 1000 of FIG. 1 and the ESD protection device 2000 of FIG. 19.

Structures and operations of the ESD protection device 1000 of FIG. 1 and the ESD protection device 2000 of FIG. 19 are described above with reference to FIGS. 1 to 19. Therefore, detailed description about the ESD protection device 3200 will be omitted here.

In one or more example embodiments, the electronic device 3000 may be a smart phone, a mobile phone, a personal digital assistant (PDA), a portable multimedia player (PMP), a digital camera, a music player, a portable game console, a navigation system, a laptop computer, etc.

Figure 21:
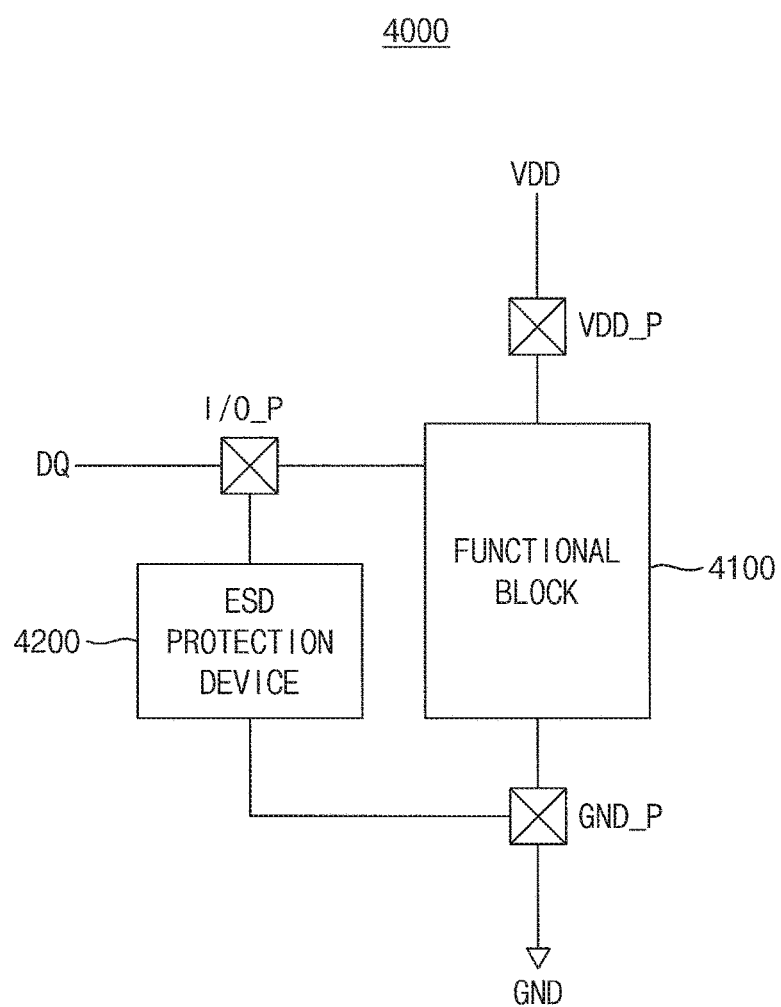
FIG. 21 is a block diagram illustrating an electronic device according to example embodiments.

FIG. 21 is a block diagram illustrating an electronic device according to example embodiments.

Referring to FIG. 21, an electronic device 4000 includes a functional block 4100 and an ESD protection device 4200.

The functional block 4100 is coupled to a supply voltage pad VDD_P coupled to a supply voltage VDD, a ground voltage pad GND_P coupled to a ground voltage GND, and a data input/output pad I/O_P. The functional block 4100 communicates (i.e., receives and transmits) data DQ through the data input/output pad I/O_P, using the supply voltage VDD. In one or more example embodiments, the functional block 4100 may include at least one among an application processor, a data input/output circuit, a logic circuit, a memory device, and a PMIC.

The ESD protection device 4200 is coupled between the data input/output pad I/O_P and the ground voltage pad GND_P. When an ESD event occurs such that a plurality of positive charges flow in the ESD protection device 4200 through the data input/output pad I/O_P, the ESD protection device 4200 may be turned on to discharge the positive charges to the ground voltage pad GND_P.

The ESD protection device 4200 may be implemented with one among the ESD protection device 1000 of FIG. 1 and the ESD protection device 2000 of FIG. 19.

Structures and operations of the ESD protection device 1000 of FIG. 1 and the ESD protection device 2000 of FIG. 19 are described above with reference to FIGS. 1 to 19. Therefore, detailed description about the ESD protection device 4200 will be omitted here.

In one or more example embodiments, the electronic device 4000 may be a smart phone, a mobile phone, a PDA, a PMP, a digital camera, a music player, a portable game console, a navigation system, a laptop computer, etc.

Although a few example embodiments have been shown and described, it would be appreciated by those skilled in the art that changes may be made in the example embodiments without departing from the principles and spirit of the disclosure, the scope of that is defined in the claims and their equivalents.

What is claimed is:
1. An electrostatic discharge (ESD) protection device comprising:
an N-type laterally diffused metal oxide semiconductor (LDMOS) transistor comprising a source electrode, a gate electrode, and a well bias electrode that are connected to a first pad receiving a first voltage, the N-type LDMOS transistor further comprising a drain electrode connected to a middle node; and
a silicon controlled rectifier (SCR) connected to the N-type LDMOS transistor in series, the SCR comprising a first end connected to the middle node and the drain electrode of the N-type LDMOS transistor, and the SCR further comprising a second end connected to a second pad receiving a second voltage higher than the first voltage,
wherein the SCR comprises:
a first N-type drift region;
an N-type well region disposed in the first N-type drift region;
a first N-type doping region disposed in the N-type well region, the first N-type doping region being connected to the second pad; and
a first P-type doping region disposed in the first N-type drift region, the first P-type doping region being connected to the second pad.

2. The ESD protection device of claim 1, wherein the SCR comprises an N-type floating diffusion region disposed in the first N-type drift region, the N-type floating diffusion region being electrically floating.

3. The ESD protection device of claim 2, wherein a first impurity concentration of the N-type floating diffusion region is higher than a second impurity concentration of the first N-type drift region.

4. The ESD protection device of claim 1, wherein the N-type LDMOS transistor comprises:
a P-type well region;
a second N-type doping region disposed in the P-type well region, the second N-type doping region being connected to the source electrode;

a second P-type doping region disposed in the P-type well region, the second P-type doping region being connected to the well bias electrode;

a second N-type drift region;

a third N-type doping region disposed in the second N-type drift region, the third N-type doping region being connected to the drain electrode; and a gate disposed above a first portion of the P-type well region and a second portion of the second N-type drift region, the gate being connected to the gate electrode.

5. The ESD protection device of claim 1, further comprising a shunting diode comprising an anode electrode connected to the first pad, and a cathode electrode connected to the second pad.

6. An electrostatic discharge (ESD) protection device comprising:

an N-type laterally diffused metal oxide semiconductor (LDMOS) transistor comprising a source electrode, a gate electrode, and a well bias electrode that are connected to a first pad receiving a first voltage, and a drain electrode connected to a middle node; and a silicon controlled rectifier (SCR) connected between the middle node and a second pad receiving a second voltage higher than the first voltage, wherein the SCR comprises:

an N-type drift region;

a P-type body region contacting the N-type drift region;

a first N-type well region disposed in the N-type drift region;

an N-type floating diffusion region disposed in the N-type drift region, the N-type floating diffusion region being spaced apart from the first N-type well region and being electrically floating;

a first N-type doping region disposed in the first N-type well region, the first N-type doping region being connected to the second pad;

a first P-type doping region disposed in the N-type drift region between the first N-type well region and the N-type floating diffusion region, the first P-type doping region being connected to the second pad;

a second N-type doping region disposed in the P-type body region, the second N-type doping region being connected to the middle node; and a second P-type doping region disposed in the P-type body region, the second P-type doping region being connected to the middle node.

7. The ESD protection device of claim 6, wherein the N-type floating diffusion region is spaced apart from the first N-type well region in a direction of the P-type body region.

8. The ESD protection device of claim 6, wherein the second N-type doping region contacts the second P-type doping region.

9. The ESD protection device of claim 6, wherein the SCR further comprises a first gate disposed above the N-type drift region and the P-type body region and between the N-type floating diffusion region and the second N-type doping region, the first gate being connected to the middle node.

10. The ESD protection device of claim 9, wherein the second N-type doping region surrounds the second P-type doping region in a track pattern.

11. The ESD protection device of claim 10, wherein the first gate surrounds the second N-type doping region in a first track pattern.

12. The ESD protection device of claim 11, wherein the N-type floating diffusion region surrounds the first gate in a second track pattern.

13. The ESD protection device of claim 9, wherein the SCR further comprises:

a diode comprising a cathode electrode connected to the second pad, and an anode electrode connected to the first gate; and a resistor connected between the first gate and the middle node, wherein the diode comprises a P-type LDMOS transistor comprising:

a second gate connected to the cathode electrode;

a second N-type well region;

a third N-type doping region disposed in the second N-type well region, the third N-type doping region being connected to the cathode electrode;

a P-type drift region; and a third P-type doping region disposed in the P-type drift region, the third P-type doping region being connected to the anode electrode.

14. The ESD protection device of claim 13, wherein the third P-type doping region corresponds to a drain region of the P-type LDMOS transistor, and the third N-type doping region corresponds to a well bias region of the P-type LDMOS transistor.

* * * * *